US012635413B2

(12) United States Patent
Ganti et al.

(10) Patent No.: US 12,635,413 B2
(45) Date of Patent: May 19, 2026

(54) DRIVING OF PIEZOELECTRICS FOR MEMS-BASED COOLING SYSTEMS

(71) Applicant: Frore Systems Inc., San Jose, CA (US)

(72) Inventors: Suryaprakash Ganti, Los Altos, CA (US); Ganapathy Sankar, Cupertino, CA (US); Vikram Mukundan, San Ramon, CA (US); Ananth Saran Yalamarthy, Stanford, CA (US)

(73) Assignee: Frore Systems Inc., San Jose, CA (US)

( * ) Notice: Subject to any disclaimer, the term of this patent is extended or adjusted under 35 U.S.C. 154(b) by 871 days.

(21) Appl. No.: 17/860,564

(22) Filed: Jul. 8, 2022

(65) Prior Publication Data

US 2023/0012794 A1 Jan. 19, 2023

Related U.S. Application Data

(60) Provisional application No. 63/220,371, filed on Jul. 9, 2021.

(51) Int. Cl.
| | |
|---|---|
| *H01L 41/04* | (2006.01) |
| *B81B 7/00* | (2006.01) |
| *H01L 23/367* | (2006.01) |
| *H10N 30/20* | (2023.01) |
| *H10N 30/30* | (2023.01) |
| *H10N 30/80* | (2023.01) |

(52) U.S. Cl.
CPC ........... *H10N 30/20* (2023.02); *B81B 7/0093* (2013.01); *H01L 23/3675* (2013.01); *H10N 30/306* (2023.02); *H10N 30/802* (2023.02)

(58) Field of Classification Search
CPC ..... H10N 30/20; H10N 30/802; H10N 30/306
USPC .......................................................... 310/328
See application file for complete search history.

(56) References Cited

U.S. PATENT DOCUMENTS

| | | | |
|---|---|---|---|
| 7,282,837 B2 | 10/2007 | Scher | |
| RE45,376 E | 2/2015 | Arik | |
| 9,214,622 B2 * | 12/2015 | Zhang | ................. H10N 30/2047 |
| 10,947,965 B2 | 3/2021 | Tanaka | |
| 2005/0046309 A1 * | 3/2005 | Kim | ...................... F04B 43/046 |
| | | | 310/328 |
| 2005/0089415 A1 | 4/2005 | Cho | |

(Continued)

FOREIGN PATENT DOCUMENTS

| | | |
|---|---|---|
| CN | 1993030 | 7/2007 |
| CN | 104640708 | 5/2015 |
| CN | 108025331 | 5/2018 |

*Primary Examiner* — Derek J Rosenau
(74) *Attorney, Agent, or Firm* — Van Pelt, Yi & James LLP

(57) ABSTRACT

A cooling system is described. The cooling system includes a support structure, a cooling element, and drive electronics. The cooling element has a central axis and is supported by the support structure at the central axis. First and second portions of the cooling element are on first and second sides of the central axis and unpinned. The first and second portions of the cooling element undergo vibrational motion when actuated to drive a fluid toward a heat-generating structure. The cooling element further has first and second piezoelectrics having opposite polarizations. The first piezoelectric is part of the first portion of the cooling element. The second piezoelectric is part of the second portion of the cooling element. The drive electronics drive the first and second portions of the cooling element using a single drive signal.

20 Claims, 12 Drawing Sheets

(56)                    References Cited

U.S. PATENT DOCUMENTS

| | | |
|---|---|---|
| 2005/0225213 A1 | 10/2005 | Richards |
| 2007/0037506 A1* | 2/2007 | Lee ......................... F04D 33/00 |
| | | 454/184 |
| 2008/0304979 A1 | 12/2008 | Lucas |
| 2010/0315179 A1 | 12/2010 | Schoepf |
| 2011/0063800 A1 | 3/2011 | Park |
| 2013/0210175 A1 | 8/2013 | Hoisington |
| 2014/0151457 A1 | 6/2014 | Wilkerson |
| 2015/0115846 A1 | 4/2015 | Choi |
| 2019/0101938 A1 | 4/2019 | Mou |
| 2020/0051895 A1 | 2/2020 | Ganti |
| 2021/0185856 A1 | 6/2021 | Ganti |

* cited by examiner

100

100

100

100

100

100

120'

200

200

300

300

Heat-Generating Structure/Heat Spreader     302

300

300

300

400

480

600

600

900

DRIVING OF PIEZOELECTRICS FOR MEMS-BASED COOLING SYSTEMS

CROSS REFERENCE TO OTHER APPLICATIONS

This application claims priority to U.S. Provisional Patent Application No. 63/220,371 entitled MEMS-BASED ACTIVE COOLING SYSTEMS INCLUDING COOLING CELL ARRANGEMENT, TABS, ANCHOR BONDING, INTEGRATED SPREADER, ADHESIVE, AND POWER MANAGEMENT filed Jul. 9, 2021, which is incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Moreover, incorporating cooling solutions into computing devices may be challenging. Consequently, additional cooling solutions for computing devices are desired.

BRIEF DESCRIPTION OF THE DRAWINGS

Various embodiments of the invention are disclosed in the following detailed description and the accompanying drawings.

DETAILED DESCRIPTION

Figure 1A:
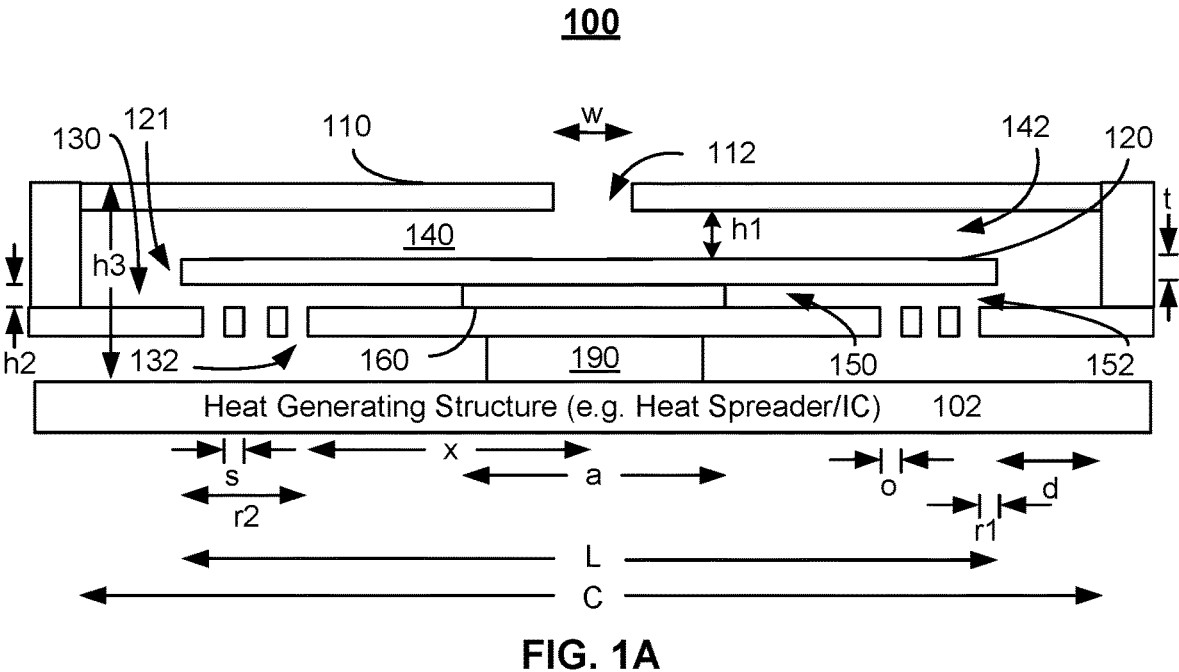
FIGS. 1A-1G depict an embodiment of an active MEMS cooling system including a centrally anchored cooling element.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebook computers, and virtual reality devices as well as for other computing devices such as servers, can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated. Further, other components in a computing device may generate heat. Thus, thermal management is increasingly an issue for computing devices.

Larger computing devices, such as laptop computers, desktop computers, or servers, include active cooling systems. Active cooling systems are those in which an electrical signal is used to drive cooling. An electric fan that has rotating blades is an example of an active cooling system, while a heat sink is an example of a passive cooling system. When energized, the fan's rotating blades drive air through the larger devices to cool internal components. However, space and other limitations in computing devices limit the use of active cooling systems. Fans are typically too large for mobile and/or thinner devices such as smartphones and tablet or notebook computers. Fans also may have limited efficacy because of the boundary layer of air existing at the surface of the components, because they provide a limited airspeed for air flow across the hot surface desired to be cooled, and because they may generate an excessive amount of noise. Fans also have a limited backpressure. Space and power limitations may further restrict the ability to provide electrical connection to active cooling systems. For example, if multiple active cooling systems are used, the connections to the active cooling systems may be required to fit within a small area. In addition, the power consumed by such a cooling system may be desired to be small, particularly for mobile devices. Consequently, active cooling systems face particular challenges when used in computing devices such as active computing devices. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated. Thus, additional cooling solutions are desired.

A cooling system including a support structure, a cooling element, and drive electronics is described. The cooling element has a central axis and is supported by the support structure at the central axis such that a first portion of the cooling element is on a first side of the central axis and a second portion of the cooling element is on a second side of the central axis opposite to the first side. The first and second portions are unpinned. Stated differently, a portion of the perimeter for the first and second portions of the cooling element is free to move. The first portion and the second portion of the cooling element are configured to undergo vibrational motion when actuated to drive a fluid toward a heat-generating structure. The cooling element further includes a first piezoelectric having a first polarization (or poling) and a second piezoelectric having a second polarization (or poling). The second polarization is opposite to the first polarization. In some embodiments, the drive electronics apply a first electric field to the first piezoelectric along the first polarization and a second electric field to the second piezoelectric along the second polarization. The first electric field does not exceed one-half of a first coercivity of the first piezoelectric in a first direction opposite to the first polarization. The second electric field does not exceed one-half of a second coercivity of the second piezoelectric in a second direction opposite to the second polarization. The first piezoelectric is part of the first portion of the cooling element. The second piezoelectric is part of the second portion of the cooling element. The drive electronics are configured to drive the first portion of the cooling element and the second portion of the cooling element using a single drive signal. The first piezoelectric and the second piezoelectric may be oppositely biased such that the cooling element is driven in an out-of-phase mode by the drive electronics.

In some embodiments, the cooling element also includes an actuator. The first piezoelectric is on a first portion of the actuator. The second piezoelectric is on a second portion of the actuator. The actuator may be electrically conductive and electrically isolated from at least the support structure. The drive electronics provide the single drive signal to the actuator. The drive electronics may also include a flex connector that provides the single drive signal to the actuator, a first bias to the first piezoelectric, and a second bias to the second piezoelectric.

In some embodiments, the cooling element further includes at least one insulator and electrical contact(s). The insulator(s) are between the first piezoelectric and the actuator and between the second piezoelectric and the actuator. The electrical contact(s) are on the insulator(s). The electrical contact(s) receive the single drive signal and provide the single drive signal to a first side of the first piezoelectric and to a first side of the second piezoelectric. In some such embodiments, the drive electronics further include a flex connector providing a first bias signal to a second side of the first piezoelectric and providing a second bias signal to a second side of the second piezoelectric. The flex connector may also provide the single drive signal to the electrical contact. The first side of the first piezoelectric is opposite to the second side of the first piezoelectric. The first side of the second piezoelectric is opposite to the second side of the second piezoelectric.

In some embodiments, the cooling element includes at least one insulator, a first electrical contact, and a second electrical contact. The insulator(s) are between the first piezoelectric and the actuator and between the second piezoelectric and the actuator. The first electrical contact is on a first portion of the insulator(s). The first electrical contact is electrically connected to the first piezoelectric and provides a first bias to the first piezoelectric. The second electrical contact is on a second portion of the insulator(s). The second electrical contact is electrically connected to the second piezoelectric and provides a second bias to the second piezoelectric. The drive electronics further include a flex connector providing the single drive signal to the first piezoelectric and the second piezoelectric.

In some embodiments the cooling system includes a plurality of cooling cells. Each cell may include the support structure, cooling element and bottom plates described herein. A method of cooling a heat-generating structure is also described. In some embodiments, the method includes driving cooling element(s) in the systems described herein. In some such embodiments, the cooling element(s) are driven at or near resonance.

Figure 1B:
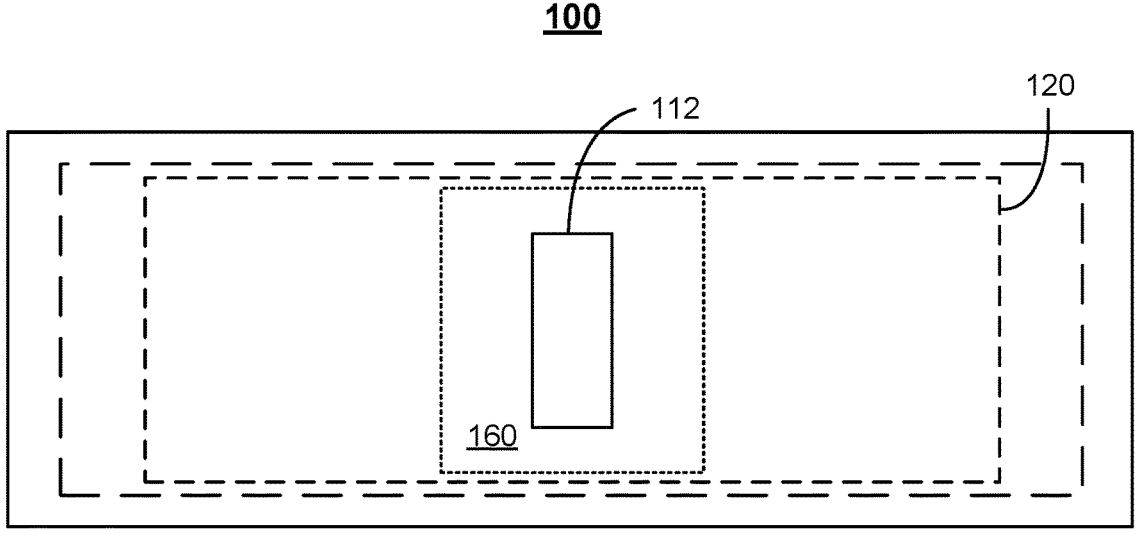
Figure 1C:
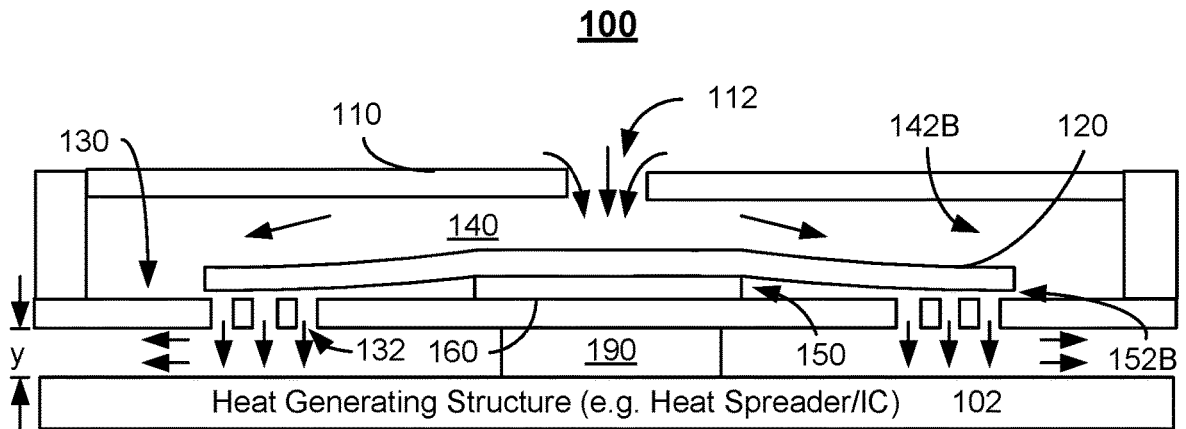
Figure 1D:
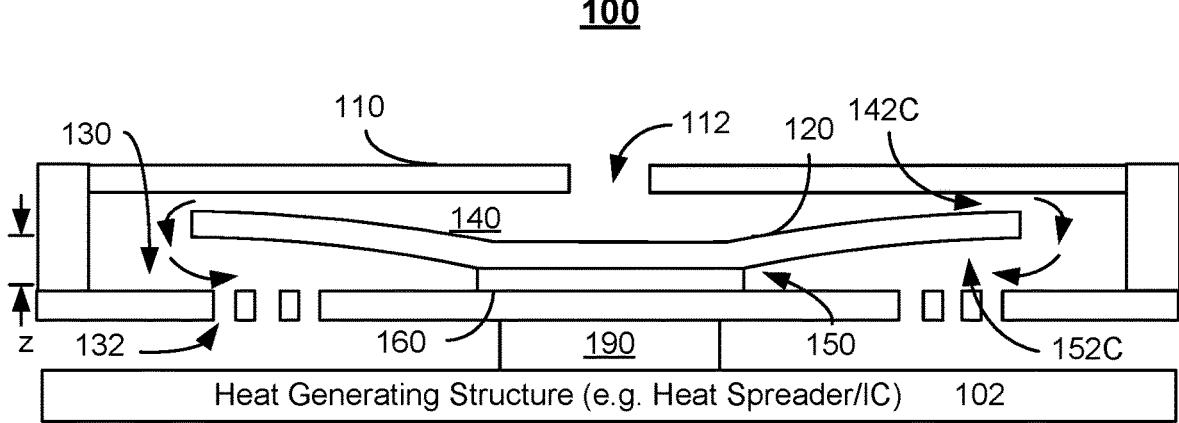
Figure 1E:
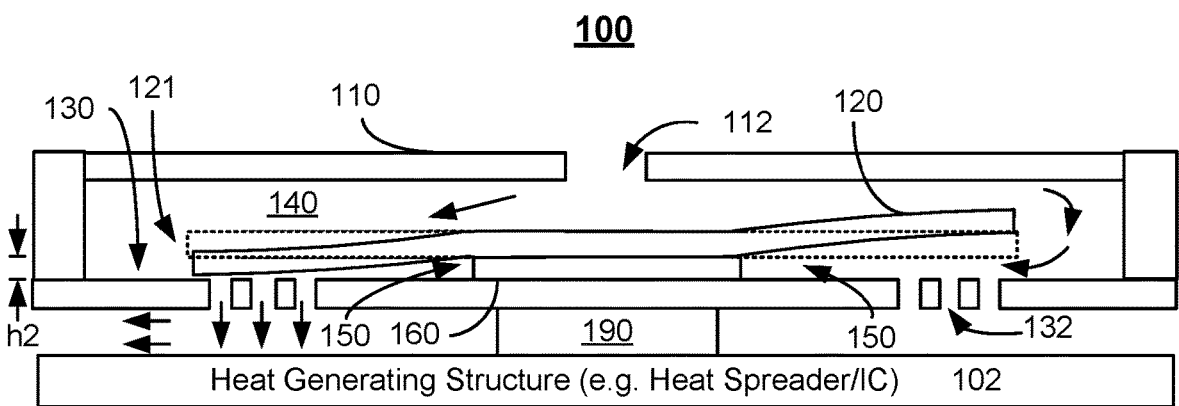
Figure 1F:
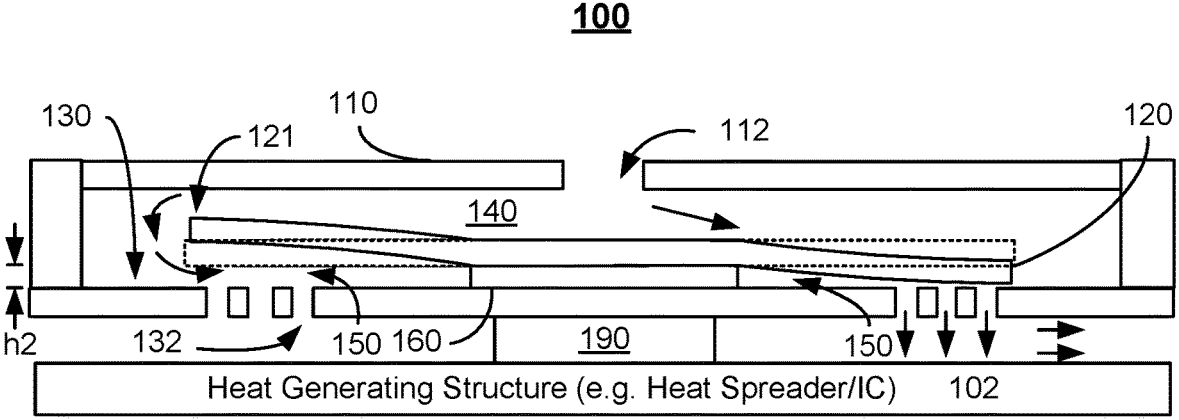
Figure 1G:
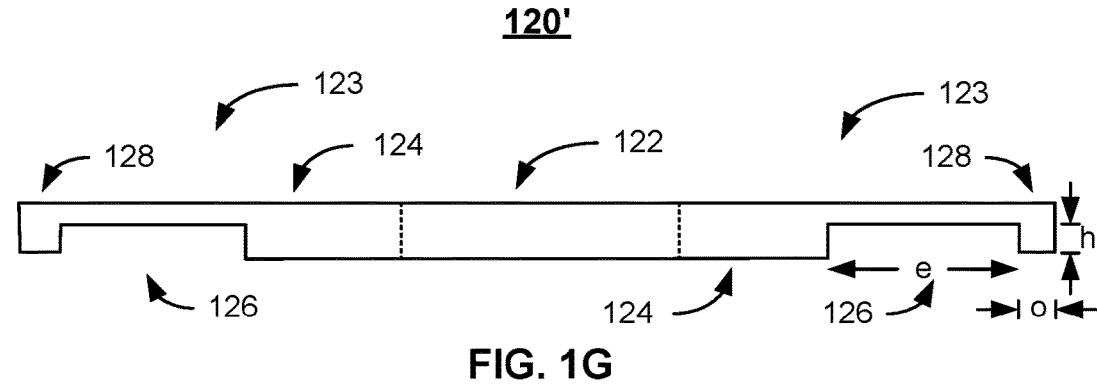

FIGS. 1A-1G are diagrams depicting an exemplary embodiment of active MEMS cooling system 100 usable with heat-generating structure 102 and including a centrally anchored cooling element 120 or 120'. Cooling element 120 is shown in FIGS. 1A-1F and cooling element 120' is shown in FIG. 1G. For clarity, only certain components are shown. FIGS. 1A-1G are not to scale. FIGS. 1A and 1B depict cross-sectional and top views of cooling system 100 in a neutral position. FIGS. 1C-1D depict cooling system 100 during actuation for in-phase vibrational motion. FIGS. 1E-1F depict cooling system 100 during actuation for out-of-phase vibrational motion. Although shown as symmetric, cooling system 100 need not be.

Cooling system 100 includes top plate 110 having vent 112 therein, cooling element 120, orifice plate 130 having orifices 132 therein, support structure (or "anchor") 160 and chambers 140 and 150 (collectively chamber 140/150) formed therein. Cooling element 120 is supported at its central region by anchor 160. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A. Also shown is pedestal 190 that connects orifice plate 130 to and offsets orifice plate 130 from heat-generating structure 102. In some embodiments, pedestal 190 also thermally couples orifice plate 130 to heat-generating structure 102. In some embodiments, an additional jet channel plate may be present and supported by pedestal 190. Thus orifice plate 130 and/or such a jet channel plate may be part or all of a bottom plate supported by pedestal 190. Thus, multiple plates and/or plate(s) having various structures may be used at the bottom plate for cooling system 100.

FIG. 1A depicts cooling system 100 in a neutral position. Thus, cooling element 120 is shown as substantially flat. For in-phase operation, cooling element 120 is driven to vibrate between positions shown in FIGS. 1C and 1D. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure 102 may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled. In some embodiments, heat-generating structure 102 may be a thermally conductive part of a module containing cooling system 100. For example, cooling system 100 may be affixed to heat-generating structure 102, which may be coupled to another heat sink, vapor chamber, integrated circuit, or other separate structure desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electromechanical system (MEMS) cooling system capable of residing within mobile computing devices and/or other devices having limited space in at least one dimension. For example, the total height, h3, of cooling system 100 (from the top of heat-generating structure 102 to the top of top plate 110) may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than 1.2 millimeter. For example, y may be at least two hundred and fifty micrometers and not more than three hundred micrometers. In some embodiments, y is at least five hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system 100 resides (e.g. in an enclosed device).

Cooling element 120 can be considered to divide the interior of active MEMS cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1F). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a seesaw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1F, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1F. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130. Thus, cooling element 120 may be viewed as an actuator. Although described in the context of a single, continuous cooling element, in some embodiments, cooling element 120 may be formed by two (or more) cooling elements. Each of the cooling elements is depicted as one portion pinned (e.g. supported by support structure 160) and an opposite portion unpinned. Thus, a single, centrally supported cooling element 120 may be formed by a combination of multiple cooling elements supported at an edge.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1F) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C, of chamber 140/150 is close to the length, L, of cooling element 120. For example, in some embodiments, the distance, d, between the edge of cooling element 120 and the wall of chamber 140/150 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, C/2=nλ/4, where λ is the acoustic wavelength for the fluid and n is odd (e.g. n=1, 3, 5, etc.). For the lowest order mode, C=λ/2. Because the length of chamber 140 (e.g. C) is close to the length of cooling element 120, in some embodiments, it is also approximately true that L/2=nλ/4, where λ is the acoustic wavelength for the fluid and n is odd. Thus, the frequency at which cooling element 120 is driven, ν, is at or near the structural resonant frequency for cooling element 120. The frequency ν is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency rather than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 130) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments, r1 is at least one hundred micrometers (e.g. r1≥100 μm) and r2 is not more than one millimeter (e.g. r2≤1000 μm). In some embodiments, orifices 132 are at least two hundred micrometers from tip 121 of cooling element 120 (e.g. r1≥200 μm). In some such embodiments, orifices 132 are at least three hundred micrometers from tip 121 of cooling element 120 (e.g. r1≥300 μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling elements though it is possible that a mechanism other than a piezoelectric might be used to drive the cooling element. In some embodiments, cooling element 120 includes a piezoelectric layer on substrate. The substrate may include or consist of stainless steel, a Ni alloy, Hastelloy, Al (e.g. an Al alloy), and/or Ti (e.g. a Ti alloy such as Ti6Al-4V). In some embodiments, a piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation, or other layers might be included in the piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Operation of cooling system 100 is described in the context of FIGS. 1A-1F. Although described in the context of particular pressures, gap sizes, and timing of flow, operation of cooling system 100 is not dependent upon the explanation herein. FIGS. 1C-1D depict in-phase operation of cooling system 100. Referring to FIG. 1C, cooling element 120 has been actuated so that its tip 121 moves away from top plate 110. FIG. 1C can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1C. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat-generating structure 102 is shown by unlabeled arrows in FIG. 1C.

Cooling element 120 is also actuated so that tip 121 moves away from heat-generating structure 102 and toward top plate 110. FIG. 1D can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1D. Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1D. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 150. Moreover, cooling system 100 may operate such that fluid is drawn in through vent 112 and driven out through orifices 132 without cooling element 120 contacting top plate 110 or orifice plate 130. Thus, pressures are developed within chambers 140 and 150 that effectively open and close vent 112 and orifices 132 such that fluid is driven through cooling system 100 as described herein.

The motion between the positions shown in FIGS. 1C and 1D is repeated. Thus, cooling element 120 undergoes vibrational motion indicated in FIGS. 1A-1D, drawing fluid through vent 112 from the distal side of top plate 110 into top chamber 140; transferring fluid from top chamber 140 to bottom chamber 150; and pushing the fluid through orifices

132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to the distal side of top plate 110 after cooling. In other embodiments, heated fluid is carried away and replaced by new fluid at the distal side of cooling element 120. As a result, heat-generating structure 102 may be cooled.

FIGS. 1E-1F depict an embodiment of active MEMS cooling system 100 including centrally anchored cooling element 120 in which the cooling element is driven out-of-phase. More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Movement of a section of cooling element 120 toward top plate 110 (an upstroke) drives fluid in top chamber 140 to bottom chamber 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. Because fluid is driven through orifices 132 at high speeds, cooling system 100 may be viewed as a MEMs jet. The movement of fluid is shown by unlabeled arrows in FIGS. 1E and 1F. The motion between the positions shown in FIGS. 1E and 1F is repeated. Thus, cooling element 120 undergoes vibrational motion indicated in FIGS. 1A, 1E, and 1F, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to the distal side of top plate 110 after cooling. In other embodiments, heated fluid is carried away and replaced by new fluid at the distal side of cooling element 120. As a result, heat-generating structure 102 may be cooled.

Although shown in the context of a uniform cooling element in FIGS. 1A-1F, cooling system 100 may utilize cooling elements having different shapes. FIG. 1G depicts an embodiment of engineered cooling element 120' having a tailored geometry and usable in a cooling system such as cooling system 100. Cooling element 120' includes an anchored region 122 and cantilevered arms 123. Anchored region 122 is supported (e.g. held in place) in cooling system 100 by anchor 160. Cantilevered arms 123 undergo vibrational motion in response to cooling element 120' being actuated. Each cantilevered arm 123 includes step region 124, extension region 126 and outer region 128. In the embodiment shown in FIG. 1G, anchored region 122 is centrally located. Step region 124 extends outward from anchored region 122. Extension region 126 extends outward from step region 124. Outer region 128 extends outward from extension region 126. In other embodiments, anchored region 122 may be at one edge of the actuator and outer region 128 at the opposing edge. In such embodiments, the actuator is edge anchored.

Extension region 126 has a thickness (extension thickness) that is less than the thickness of step region 124 (step thickness) and less than the thickness of outer region 128 (outer thickness). Thus, extension region 126 may be viewed as recessed. Extension region 126 may also be seen as providing a larger bottom chamber 150. In some embodiments, the outer thickness of outer region 128 is the same as the step thickness of step region 124. In some embodiments, the outer thickness of outer region 128 is different from the step thickness of step region 124. In some embodiments, outer region 128 and step region 124 each have a thickness of at least three hundred twenty micrometers and not more than three hundred and sixty micrometers. In some embodiments, the outer thickness is at least fifty micrometers and not more than two hundred micrometers thicker than the extension thickness. Stated differently, the step (difference in step thickness and extension thickness) is at least fifty micrometers and not more than two hundred micrometers. In some embodiments, the outer step (difference in outer thickness and extension thickness) is at least fifty micrometers and not more than two hundred micrometers. Outer region 128 may have a width, o, of at least one hundred micrometers and not more than three hundred micrometers. Extension region 126 has a length, e, extending outward from the step region of at least 0.5 millimeter and not more than 1.5 millimeters in some embodiments. In some embodiments, outer region 128 has a higher mass per unit length in the direction from anchored region 122 than extension region 126. This difference in mass may be due to the larger size of outer region 128, a difference in density between portions of cooling element 120, and/or another mechanism.

Use of engineered cooling element 120' may further improve efficiency of cooling system 100. Extension region 126 is thinner than step region 124 and outer region 128. This results in a cavity in the bottom of cooling element 120' corresponding to extension region 126. The presence of this cavity aids in improving the efficiency of cooling system 100. Each cantilevered arm 123 vibrates towards top plate 110 in an upstroke and away from top plate 110 in a downstroke. When a cantilevered arm 123 moves toward top plate 110, higher pressure fluid in top chamber 140 resists the motion of cantilevered arm 123. Furthermore, suction in bottom chamber 150 also resists the upward motion of cantilevered arm 123 during the upstroke. In the downstroke of cantilevered arm 123, increased pressure in the bottom chamber 150 and suction in top chamber 140 resist the downward motion of cantilevered arm 123. However, the presence of the cavity in cantilevered arm 123 corresponding to extension region 126 mitigates the suction in bottom chamber 150 during an upstroke. The cavity also reduces the increase in pressure in bottom chamber 150 during a downstroke. Because the suction and pressure increase are reduced in magnitude, cantilevered arms 123 may more readily move through the fluid. This may be achieved while substantially maintaining a higher pressure in top chamber 140, which drives the fluid flow through cooling system 100. Moreover, the presence of outer region 128 may improve the ability of cantilevered arm 123 to move through the fluid being driven through cooling system 100. Outer region 128 has a higher mass per unit length and thus a higher momentum. Consequently, outer region 128 may improve the ability of cantilevered arms 123 to move through the fluid being driven through cooling system 100. The magnitude of the deflection of cantilevered arm 123 may also be increased. These benefits may be achieved while maintaining the stiffness of cantilevered arms 123 through the use of thicker step region 124. Further, the larger thickness of outer region 128 may aid in pinching off flow at the bottom of a downstroke. Thus, the ability of cooling element 120' to provide a valve preventing backflow through orifices 132 may be improved. Thus, performance of cooling system 100 employing cooling element 120' may be improved.

Further, cooling elements used in cooling system 100 may have different structures and/or be mounted differently than depicted in FIGS. 1A-1G. In some embodiments, the cooling element may have rounded corners and/or rounded ends but still be anchored along a central axis such that cantilevered arms vibrate. The cooling element may be anchored only at its central region such that the regions surrounding the anchor vibrate in a manner analogous to a jellyfish or the opening/closing of an umbrella. In some such embodiments, the cooling element may be circular or elliptical in shape. In some embodiments, the anchor may include apertures through which fluid may flow. Such an anchor may be utilized for the cooling element being anchored at its top (e.g. to the top plate). Although not indicated in FIGS. 1A-1G, the piezoelectric utilized in driving the cooling element may have various locations and/or configurations. For example, the piezoelectric may be embedded in the cooling element, affixed to one side of the cooling element (or cantilevered arm(s)), may occupy some or all of the cantilevered arms, and/or may have a location that is close to or distal from the anchored region. In some embodiments, cooling elements that are not centrally anchored may be used. For example, a pair of cooling elements that have offset apertures, that are anchored at their ends (or all edges), and which vibrate out of phase may be used. Thus, various additional configurations of cooling element 120 and/or 120', anchor 160, and/or other portions of cooling system 100 may be used.

Using the cooling system 100 actuated for in-phase vibration or out-of-phase vibration of cooling element 120 and/or 120', fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120/120' may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120/120' does not physically contact top plate 110 or orifice plate 130 during vibration. Thus, resonance of cooling element 120/120' may be more readily maintained. More specifically, physical contact between cooling element 120/120' and other structures disturbs the resonance conditions for cooling element 120/120'. Disturbing these conditions may drive cooling element 120/120' out of resonance. Thus, additional power would need to be used to maintain actuation of cooling element 120/120'. Further, the flow of fluid driven by cooling element 120/120' may decrease. These issues are avoided through the use of pressure differentials and fluid flow as discussed above. The benefits of improved, quiet cooling may be achieved with limited additional power. Further, out-of-phase vibration of cooling element 120/120' allows the position of the center of mass of cooling element 120/120' to remain more stable. Although a torque is exerted on cooling element 120/120', the force due to the motion of the center of mass is reduced or eliminated. As a result, vibrations due to the motion of cooling element 120/120' may be reduced. Moreover, efficiency of cooling system 100 may be improved through the use of out-of-phase vibrational motion for the two sides of cooling element 120/120'. Consequently, performance of devices incorporating the cooling system 100 may be improved. Further, cooling system 100 may be usable in other applications (e.g. with or without heat-generating structure 102) in which high fluid flows and/or velocities are desired.

Figure 2A:
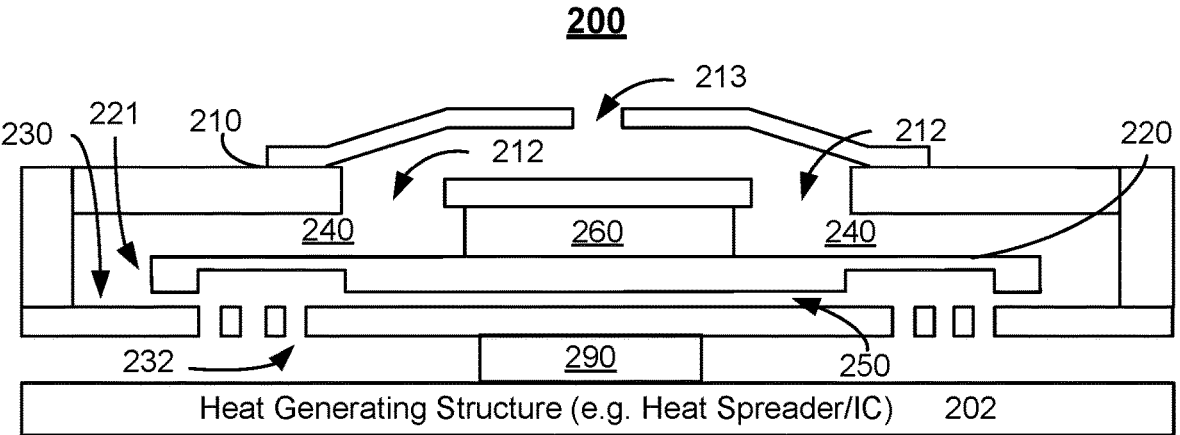
FIGS. 2A-2B depict an embodiment of an active MEMS cooling system including a centrally anchored cooling element.
Figure 2B:
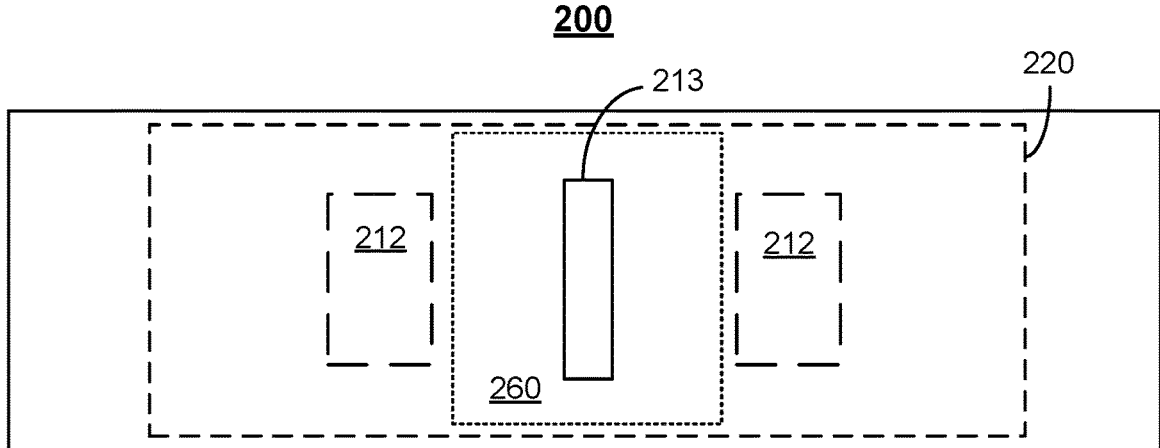

FIGS. 2A-2B depict an embodiment of active MEMS cooling system 200 including a top centrally anchored cooling element. FIG. 2A depicts a side view of cooling system 200 in a neutral position. FIG. 2B depicts a top view of cooling system 200. FIGS. 2A-2B are not to scale. For simplicity, only portions of cooling system 200 are shown. Referring to FIGS. 2A-2B, cooling system 200 is analogous to cooling system 100. Consequently, analogous components have similar labels. For example, cooling system 200 is used in conjunction with heat-generating structure 202, which is analogous to heat-generating structure 102.

Cooling system 200 includes top plate 210 having vents 212, cooling element 220 having tip 221, orifice plate 230 including orifices 232, top chamber 240 having a gap, bottom chamber 250 having a gap, flow chamber 240/250, and anchor (i.e. support structure) 260 that are analogous to top plate 110 having vent 112, cooling element 120 having tip 121, orifice plate 130 including orifices 132, top chamber 140 having gap 142, bottom chamber 150 having gap 152, flow chamber 140/150, and anchor (i.e. support structure) 160, respectively. Also shown is pedestal 290 that is analogous to pedestal 190. Thus, cooling element 220 is centrally supported by anchor 260 such that at least a portion of the perimeter of cooling element 220 is free to vibrate. In some embodiments, anchor 260 extends along the axis of cooling element 220. In other embodiments, anchor 260 is only near the center portion of cooling element 220. Although not explicitly labeled in FIGS. 2A and 2B, cooling element 220 includes an anchored region and cantilevered arms including step region, extension region, and outer regions analogous to anchored region 122, cantilevered arms 123, step region 124, extension region 126, and outer region 128 of cooling element 120'. In some embodiments, cantilevered arms of cooling element 220 are driven in-phase. In some embodiments, cantilevered arms of cooling element 220 are driven out-of-phase. In some embodiments, a simple cooling element, such as cooling element 120, may be used.

Anchor 260 supports cooling element 220 from above. Thus, cooling element 220 is suspended from anchor 260. Anchor 260 is suspended from top plate 210. Top plate 210 includes vent 213. Vents 212 on the sides of anchor 260 provide a path for fluid to flow into sides of chamber 240.

As discussed above with respect to cooling system 100, cooling element 220 may be driven to vibrate at or near the structural resonant frequency of cooling element 220. Further, the structural resonant frequency of cooling element 220 may be configured to align with the acoustic resonance of the chamber 240/250. The structural and acoustic resonant frequencies are generally chosen to be in the ultrasonic range. For example, the vibrational motion of cooling element 220 may be at the frequencies described with respect to cooling system 100. Consequently, efficiency and flow rate may be enhanced. However, other frequencies may be used.

Cooling system 200 operates in an analogous manner to cooling system 100. Cooling system 200 thus shares the benefits of cooling system 100. Thus, performance of a device employing cooling system 200 may be improved. In addition, suspending cooling element 220 from anchor 260 may further enhance performance. In particular, vibrations in cooling system 200 that may affect other cooling cells (not shown) may be reduced. For example, less vibration may be induced in top plate 210 due to the motion of cooling element 220. Consequently, cross talk between cooling system 200 and other cooling systems (e.g. other cells) or other portions of the device incorporating cooling system 200 may be reduced. Thus, performance may be further enhanced.

Figure 3A:
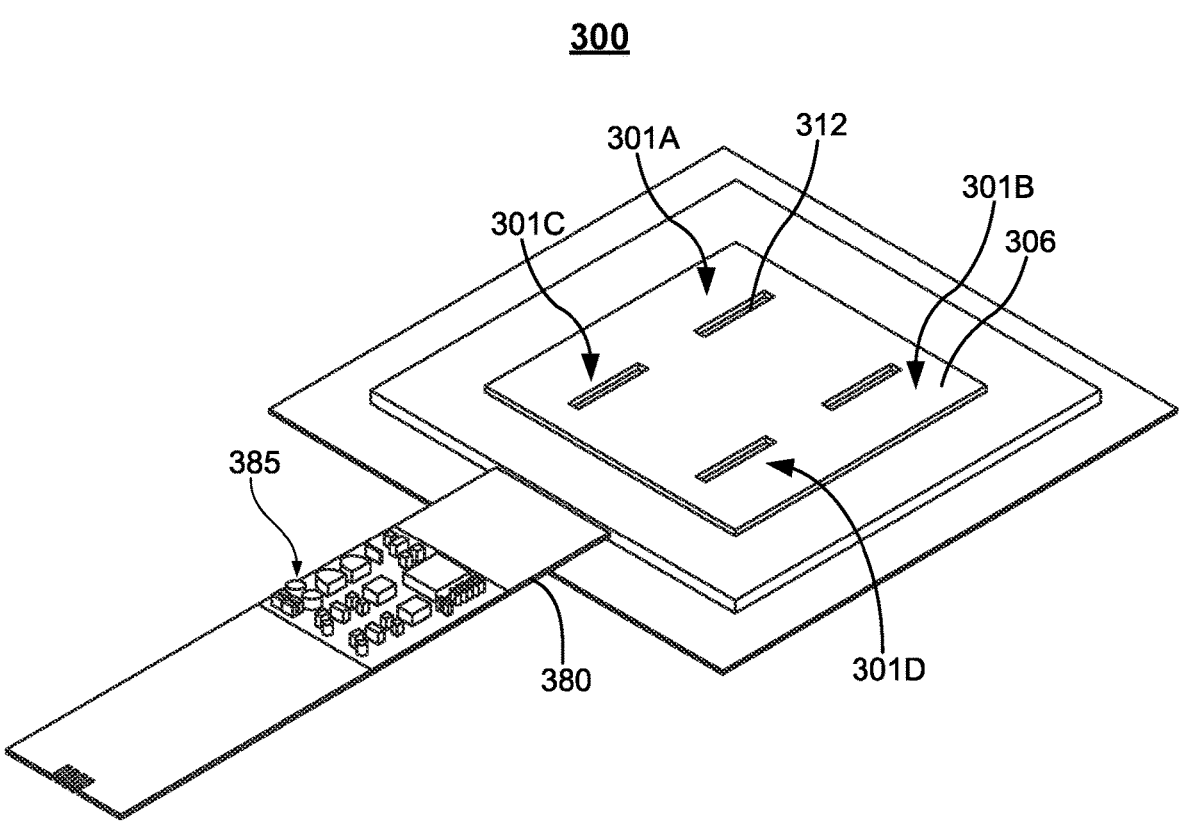
FIGS. 3A-3E depict an embodiment of an active MEMS cooling system formed in a tile.

FIGS. 3A-3E depict an embodiment of active MEMS cooling system 300 including multiple cooling cells configured as a module termed a tile, or array. FIG. 3A depicts a perspective view, while FIGS. 3B-3E depict side views. FIGS. 3A-3E are not to scale. Cooling system 300 includes four cooling cells 301A, 301B, 301C and 301D (collectively or generically 301), which are analogous to one or more of cooling systems described herein. More specifically, cooling cells 301 are analogous to cooling system 100 and/or 200. Tile 300 thus includes four cooling cells 301 (i.e. four MEMS jets). Although four cooling cells 301 in a 2×2 configuration are shown, in some embodiments another number and/or another configuration of cooling cells 301 might be employed. In the embodiment shown, cooling cells 301 include shared top plate 310 having apertures 312, cooling elements 320, shared orifice plate 330 including orifices 332, top chambers 340, bottom chambers 350, anchors (support structures) 360, and pedestals 390 that are analogous to top plate 110 having apertures 112, cooling element 120, orifice plate 130 having orifices 132, top chamber 140, bottom chamber 150, anchor 160, and pedestal 190. In some embodiments, cooling cells 301 may be fabricated together and separated, for example by cutting through top plate 310, side walls between cooling cells 301, and orifice plate 330. Thus, although described in the context of a shared top plate 310 and shared orifice plate 330, after fabrication cooling cells 301 may be separated. In some embodiments, tabs (not shown) and/or other structures such as anchors 360 may connect cooling cells 301. Further, tile 300 includes heat-generating structure (termed a heat spreader hereinafter) 302 (e.g. a heat sink, a heat spreader, and/or other structure) that also has sidewalls, or fencing, in the embodiment shown. Cover plate 306 having apertures therein is also shown. Heat spreader 302 and cover plate 306 may be part of an integrated tile 300 as shown or may be separate from tile 300 in other embodiments. Heat spreader

Figure 3B:
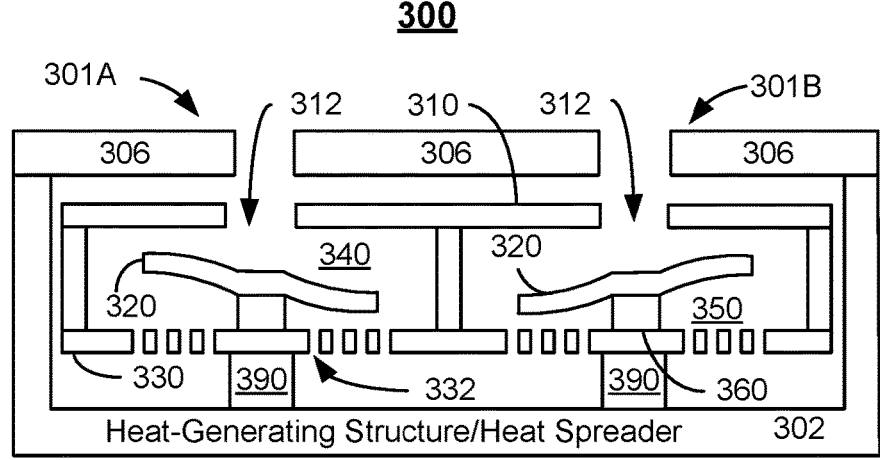
Figure 3C:
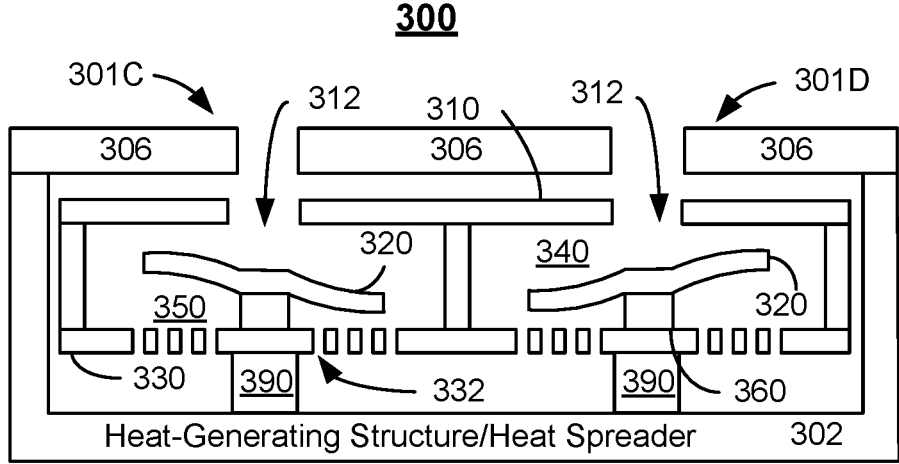
Figure 3D:
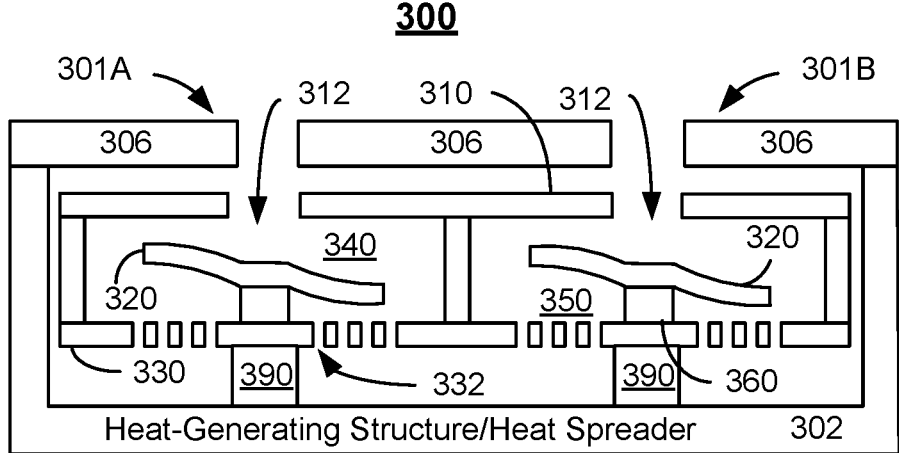
Figure 3E:
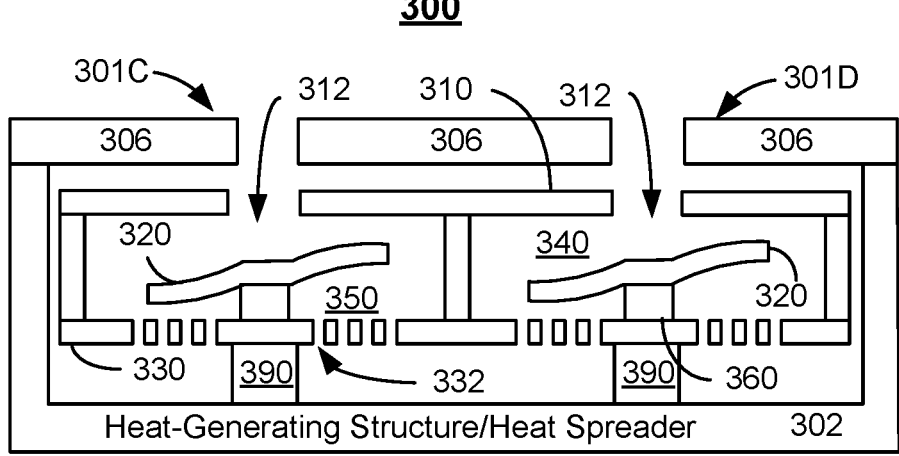

302 and cover plate 306 may direct fluid flow outside of cooling cells 301, provide mechanical stability, and/or provide protection. Electrical connection to cooling cells 301 is provided via flex connector 380 (not shown in FIGS. 3B-5E) which may house drive electronics 385. Cooling elements 320 are driven out-of-phase (i.e. in a manner analogous to a seesaw). Further, as can be seen in FIGS. 3B-3C and FIGS. 3D-3E cooling element 320 in one cell is driven out-of-phase with cooling element(s) 320 in adjacent cell(s). In FIGS. 3B-3C, cooling elements 320 in a row are driven out-of-phase. Thus, cooling element 320 in cell 301A is out-of-phase with cooling element 320 in cell 301B. Similarly, cooling element 320 in cell 301C is out-of-phase with cooling element 320 in cell 301D. In FIGS. 3D-3E, cooling elements 320 in a column are driven out-of-phase. Thus, cooling element 320 in cell 301A is out-of-phase with cooling element 320 in cell 301C. Similarly, cooling element 320 in cell 301B is out-of-phase with cooling element 320 in cell 301D. By driving cooling elements 320 out-of-phase, vibrations in cooling system 300 may be reduced. Cooling elements 320 may be driven in another manner in some embodiments.

Cooling cells 301 of cooling system 300 function in an analogous manner to cooling system(s) 100, 200, and/or an analogous cooling system. Consequently, the benefits described herein may be shared by cooling system 300. Because cooling elements in nearby cells are driven out-of-phase, vibrations in cooling system 300 may be reduced. Because multiple cooling cells 301 are used, cooling system 300 may enjoy enhanced cooling capabilities. Further, multiples of individual cooling cells 301 and/or cooling system 300 may be combined in various fashions to obtain the desired footprint of cooling cells.

Figure 4A:
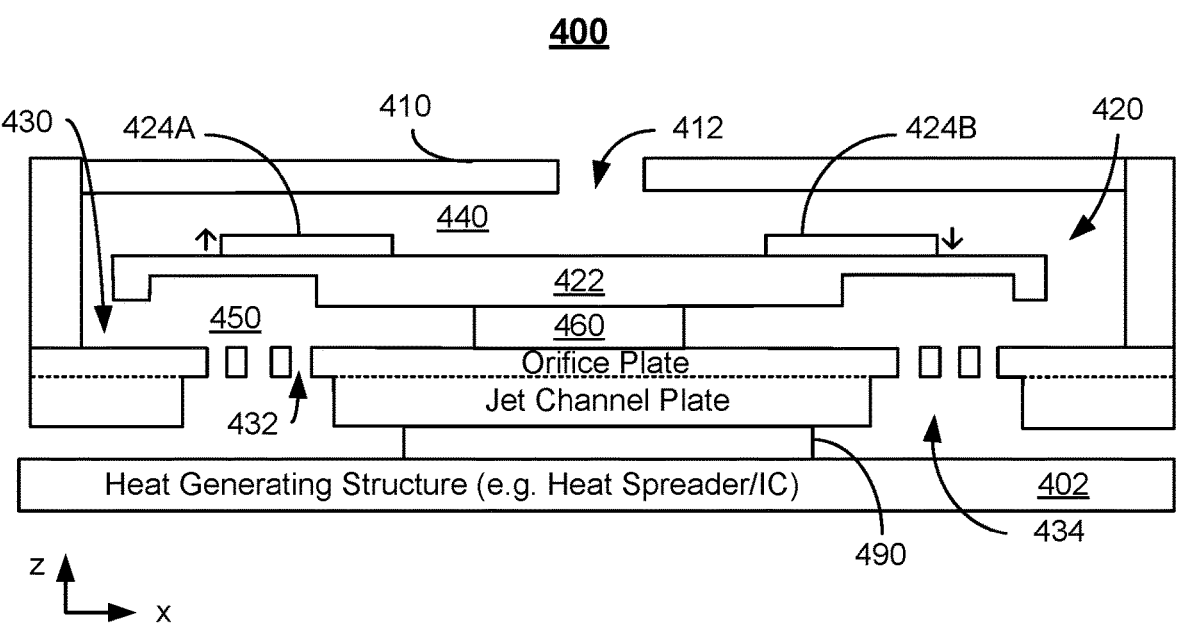
FIGS. 4A-4B depict an embodiment of an active MEMS cooling system including a centrally anchored cooling element and an embodiment of a polarization curve for the piezoelectrics.
Figure 4B:
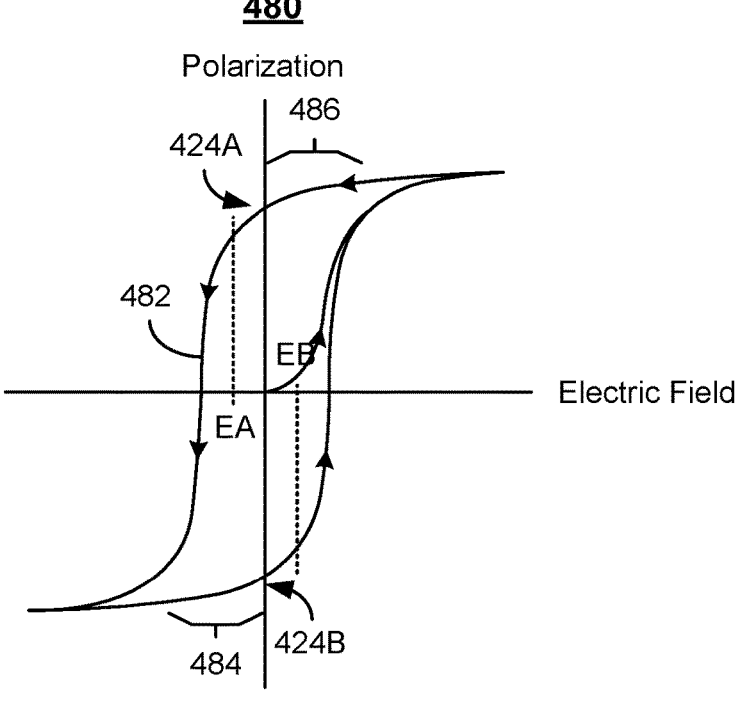

FIGS. 4A and 4B depict an embodiment of active MEMS cooling system 400 including a centrally anchored cooling element and graph 480 of an embodiment of polarization curve 482 for the piezoelectrics. FIG. 4A is not to scale and for clarity, only some structures are shown. Cooling system 400 may be a cooling cell that is part of a cooling system including multiple cells, such as tile 300. The device cooled by MEMS cooling system 400 may be a laptop computer, a tablet or notebook computer, a smart phone, and/or other mobile device. The device may also be another device, such as a server in a rack, a game console, or a desktop computer. In some embodiments, therefore, the device is thin. For example, in some embodiments, the device in which cooling system 400 is integrated has a thickness (height along the smallest dimension, the z-direction in FIG. 4A) of not more than twenty-five millimeters. The thickness is not more than ten millimeters in some embodiments. In some such embodiments, the thickness of the device is not more than eight millimeters. However, other thicknesses are possible.

Cooling system 400 includes cooling element 420, bottom plate 430 having orifices 432 and cavities 434, top chamber 440, bottom chamber 450, anchor 460, and pedestal 490 that are analogous to cooling element 120', bottom plate (e.g. orifice plate) 130 having orifices 132, top chamber 140, bottom chamber 150, anchor 160, and pedestal 190, respectively. Cooling element 420 is centrally supported by anchor 460 such that at least a portion of the perimeter of cooling element 420 is free to vibrate. In some embodiments, anchor 460 extends along the axis of cooling element 420 (i.e. perpendicular to the plane of the page). In other embodiments, anchor 460 is only near the center portion of cooling element 420. Although not explicitly labeled in FIG. 4A, cooling element 420 includes an anchored region coupled to anchor 460 and cantilevered arms. Although not labeled, the cantilevered arms include step regions, extension regions and outer regions analogous to anchored region 122, cantilevered arms 123, step region 124, extension region 126 and outer region 128 of cooling element 120'. In the embodiment shown, actuator 422 includes the step, extension, and outer regions. Cantilevered arms of cooling element 420 may be driven in-phase. In some embodiments, cantilevered arms of cooling element 420 are driven out-of-phase. In some embodiments, another cooling element such as a simple cooling element 120, may be used.

Bottom plate 430 having orifices 432 therein is analogous to bottom plate 130 and orifices 132. In addition, bottom plate 430 includes cavities 434. Bottom plate 430 may thus be considered to include an orifice plate analogous to orifice plate 130 and an additional jet channel plate that has cavities 434. The possible separation between such an orifice plate and a jet channel plate is shown by dotted lines in FIG. 4A. Also shown is heat generating structure 402, which may be a structure such as an integrated circuit that may generate heat and is desired to be cooled and/or a heat spreader (e.g. analogous to heat spreader 102 and/or 302) that is thermally coupled to a structure that is desired to be cooled.

Cooling element 420 includes actuator 422 and piezoelectrics 424A and 424B. Piezoelectrics 424A and 424B drive actuator 422 such that the cantilevered arms vibrate. In some embodiments, actuator 422 is desired to be formed of materials having a high acoustic velocity (e.g. greater than four thousand meters per second) and low internal losses. Examples of materials that may be used for actuator 422 include stainless steel such as SUS304 and/or SUS316, Al7075, Al6063, Ti64, Ti Grade 2, Ti Grade 9, a beryllium-copper alloy, Monel, aluminum bronze, aluminum bronze, and/or aluminum. In some embodiments, the actuator consists of one or more of the low internal loss materials. In some embodiments, actuator 422 includes or consists of one or more of SUS304, SUS316, Al7075, Al6063, Ti64, Ti Grade 2, and Ti Grade 9.

Piezoelectrics 424A and 424B are on opposite sides of anchor 460. Piezoelectrics 424A and 424B are part of and used to drive different cantilevered arms. Piezoelectrics 424A and 424B are also poled. Consequently, piezoelectrics 424A and 424B are polarized. The polarizations of piezoelectrics 424A and 424B are shown by arrows in FIG. 4A. In the embodiment shown, piezoelectrics 424A and 424B are oppositely polarized. In some such embodiments, the cantilevered arms of cooling element 420 are desired to be driven out-of-phase. In some embodiments, piezoelectrics 424A and 424B may be polarized in the same direction. In some such embodiments, the cantilevered arms of cooling element 420 are desired to be driven in-phase.

Cooling element 420 and drive electronics (not shown in FIG. 4A) are configured such that piezoelectrics 424A and 424B are driven using electric fields that are in the direction of polarization. Stated differently, the electric fields used are primarily in the directions of polarization. In some embodiments, the electric fields used are only in the directions of polarization. This may be understood in the context of polarization curve 482 in FIG. 4B. When at rest, piezoelectrics 424A and 424B are under the influence of zero field. The polarizations of piezoelectrics 424A and 424B are indicated in FIG. 4B along the polarization axis (for zero electric field). During operation, cooling element 420 is driven such that voltages are developed across piezoelectrics 424A and 424B. These voltages correspond to electric fields within piezoelectrics 424A and 424B that are generally parallel to the polarizations of piezoelectrics 424A and 424B (e.g. along the z-axis). Further, piezoelectrics 424A and

424B are driven by electric fields in the opposite direction. Piezoelectric 424A is driven by electric fields aligned with its polarization (i.e. in the positive z-direction), while piezoelectric 424B is driven by electric fields aligned with its polarization (i.e. in the negative z-direction). Stated differently, piezoelectric 424A is driven by electric fields that are generally in region 486 of polarization curve 482. Piezoelectric 424B is driven by electric fields that are generally in region 484 of polarization curve 482.

In some embodiments, smaller electric fields in the opposite direction from the polarization may be used. These electric fields are less than the coercivity of the piezoelectric (i.e. the electric field axis intercepts) to reduce the probability that piezoelectrics 424A and 424B are depoled. In some embodiments, an electric field that is not more than one-half of the coercivity is used. For example, piezoelectric 424A is driven by voltages that correspond to electric fields not greater than EA in the negative direction. Thus, piezoelectric 424A may be driven by electric fields from EA to zero and in region 486. Similarly, piezoelectric 424B is driven by voltages that correspond to electric fields not greater than EB in the positive electric field direction. Thus, piezoelectric 424B may be driven by electric fields from EB to zero and in region 484. In some embodiments, piezoelectrics 424A and 424B are driven by electric fields that are not more than one-third of the coercivity. In some embodiments, however, piezoelectrics 424A and 424B are driven only by electric fields along their directions of polarization. Because electric fields used to drive the piezoelectrics 424A and 424B are controlled, piezoelectrics 424A and 424B are not de-poled during use. Instead, driving cooling element 420 to vibrate and drive fluid through cooling system 400 may be viewed as reinforcing the poling of piezoelectrics 424A and 424B. Consequently, stability and reliability of cooling system 400 may be improved.

Cooling element 420 and drive electronics (not shown in FIG. 4A) are also configured such that piezoelectrics 424A and 424B can be driven using a single drive signal. In the embodiment shown, cooling element 420 is driven out-of-phase. The drive signal also provides electric fields that are aligned with the polarizations of piezoelectrics 424A and 424B. Thus, piezoelectrics 424A and 424B are differently biased in some embodiments.

Cooling system 400 operates in an analogous manner to cooling system 100. Stated differently, cooling element 420 is actuated to undergo vibrational motion and drive fluid through cooling system 400 in an analogous manner (e.g. with the same speed and/or flow rate in some embodiments) to cooling system 100. Cooling system 400 thus shares the benefits of cooling system 100. Thus, performance of a device employing cooling system 400 may be improved. Further, piezoelectrics 424A and 424B of cooling element 420 and drive electronics are configured such that the electric fields used do not depole piezoelectrics 424A and 424B. Moreover, a single drive signal may be used. This may simplify electronics and/or improve driving of cooling element 420. As a result, performance and reliability may be improved.

Figure 5A:
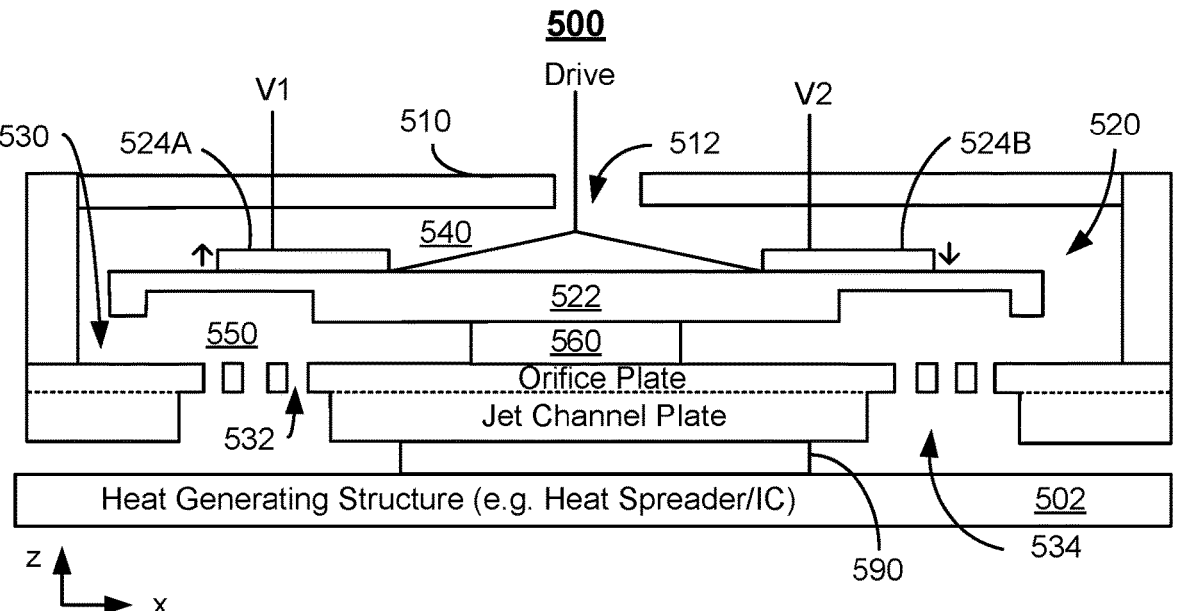
FIGS. 5A-5B depict an embodiment of an active MEMS cooling system including a centrally anchored cooling element and an embodiment of a single drive signal usable with a cooling system.
Figure 5B:
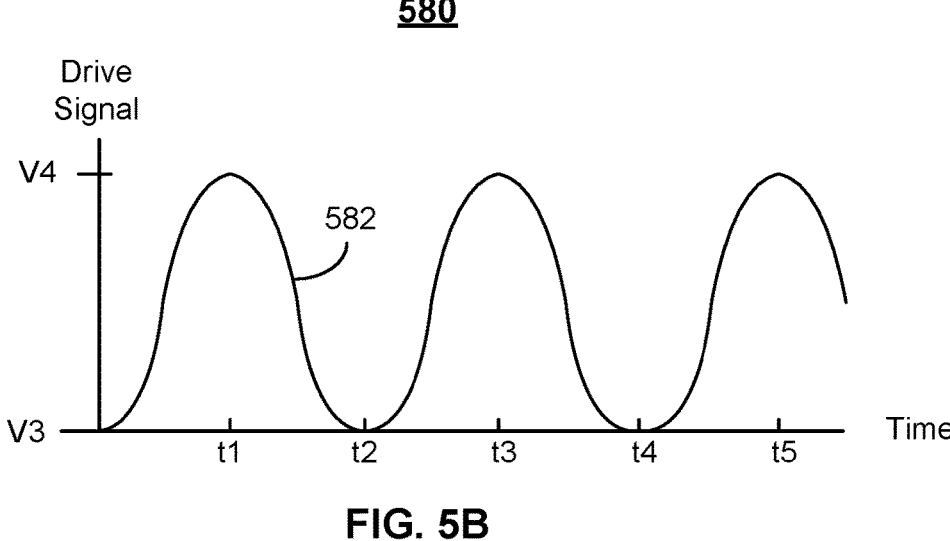

FIGS. 5A and 5B depict an embodiment of active MEMS cooling system 500 including a centrally anchored cooling element and graph 580 of an embodiment of a drive signal for the piezoelectrics. FIG. 5A is not to scale and for clarity, only some structures are shown. Cooling system 500 may be a cooling cell that is part of a cooling system including multiple cells, such as tile 300. The device cooled by MEMS cooling system 500 may be analogous to those with which cooling system 400 is used. In some embodiments, therefore, the device in which cooling system 500 is integrated has a thickness analogous to devices described with respect to cooling system 400.

Cooling system 500 includes cooling element 520, actuator 522, piezoelectrics 524A and 524B, bottom plate 530 having orifices 532 and cavities 534, top chamber 540, bottom chamber 550, anchor 560, and pedestal 590 that are analogous to cooling element 420, actuator 422, piezoelectrics 424A and 424B, bottom plate 430 having orifices 432 and cavities 434, top chamber 440, bottom chamber 450, anchor 460, and pedestal 490, respectively. Thus, cooling system 500 is analogous to 400.

Piezoelectrics 524A and 524B are on opposite sides of anchor 560, are part of the cantilevered arms, and are used to drive different cantilevered arms. Piezoelectrics 524A and 524B are also poled. The polarizations of piezoelectrics 524A and 524B are shown by arrows in FIG. 5A. In the embodiment shown, piezoelectrics 524A and 524B are oppositely polarized, in an analogous manner to piezoelectrics 424A and 424B, respectively. In some such embodiments, the cantilevered arms of cooling element 520 are desired to be driven out-of-phase. In some embodiments, piezoelectrics 524A and 524B may be polarized in the same direction. In some such embodiments, the cantilevered arms of cooling element 520 are desired to be driven in-phase.

Cooling element 520 and drive electronics (indicated by V1, V2 and Drive connected to cooling element 520) are configured such that piezoelectrics 524A and 524B are driven using electric fields that are generally in the direction of polarization and do not reach or exceed the coercivities of the piezoelectrics. Thus, cooling element 520 and drive electronics are analogous to cooling element 420 and drive electronics for cooling system 400. In the embodiment shown, piezoelectrics 524A and 524B are primarily driven by electric fields in the positive z-direction and negative z-direction, respectively.

Piezoelectrics 524A and 524B are also driven by a single drive signal. FIG. 5B depicts an embodiment of drive signal 582. Drive signal 582 varies between V3 and V4. In the embodiment shown in FIG. 5A, drive signal 582 is provided to the side of piezoelectrics 524A and 524B closest to actuator 522, while biases V1 and V2 are provided to the opposite side of piezoelectrics 524A and 524B, respectively. In some embodiments, drive signal 582 and/or biases may be coupled differently. However, the drive electronics are desired to be configured such that drive signal 582 and biases V1 and V2 develop electric fields within piezoelectrics 524A and 524B in the desired directions (e.g. not exceeding the coercivity in the direction opposite to the polarization, not exceeding one-half of the coercivity in the direction opposite to the directions of polarization, not exceeding one-third of the coercivity in the direction opposite to the polarization, and generally along the directions of polarization). Thus, the drive electronics are configured such that drive signal 582 and biases V1 and V2 may not depole piezoelectrics 424A and 424B.

In operation, a voltage V3-V1 is initially applied to piezoelectric 524A. This is the minimum voltage, and thus the electric field, applied to piezoelectric 524A. Through t1, drive signal 582 increases while bias V1 is constant. As a result, the voltage across piezoelectric 524A generates an electric field that increases in the direction of the polarization of piezoelectric 524A (i.e. the positive z-direction). A maximum electric field corresponding to voltage V4-V1 in the direction of polarization of piezoelectric 524A is reached at t1. Between t1 and t2, this electric field decreases back to a minimum. This cycle repeats. In contrast, a voltage of V2-V3 is initially applied across piezoelectric 524B. Thus, a maximum electric field in the direction of polarization of piezoelectric 524B (i.e. in the negative z-direction) is initially applied. Through t1, drive signal 582 increases while bias V2 is constant. As a result, the voltage across piezoelectric 524B generates an electric field that decreases. A minimum electric field for piezoelectric 524A is reached at t1 (where the electric field corresponds to a voltage of V2-V4). Between t1 and t2, this electric field increases back to a maximum. This cycle repeats. As a result, the voltages across piezoelectrics 524A and 524B cause piezoelectrics 524A and 524B to drive actuator 522 to vibrate out-of-phase. Thus, a single drive signal causes the cantilevered arms of cooling element 520 to vibrate out-of-phase.

Cooling system 500 operates in an analogous manner to cooling system 100. Stated differently, cooling element 520 is actuated to undergo out-of-phase vibrational motion and drive fluid through cooling system 500 in an analogous manner (e.g. with the same speed and/or flow rate in some embodiments) to cooling system 100. Cooling system 500 thus shares the benefits of cooling system 100. Thus, performance of a device employing cooling system 500 may be improved. Further, piezoelectrics 524A and 524B of cooling element 520 and drive electronics are configured such that the electric fields used may not depole piezoelectrics 524A and 524B. Moreover, a single drive signal may be used. This may simplify electronics and/or improve driving of cooling element 520. As a result, performance and reliability may be improved.

Figure 6A:
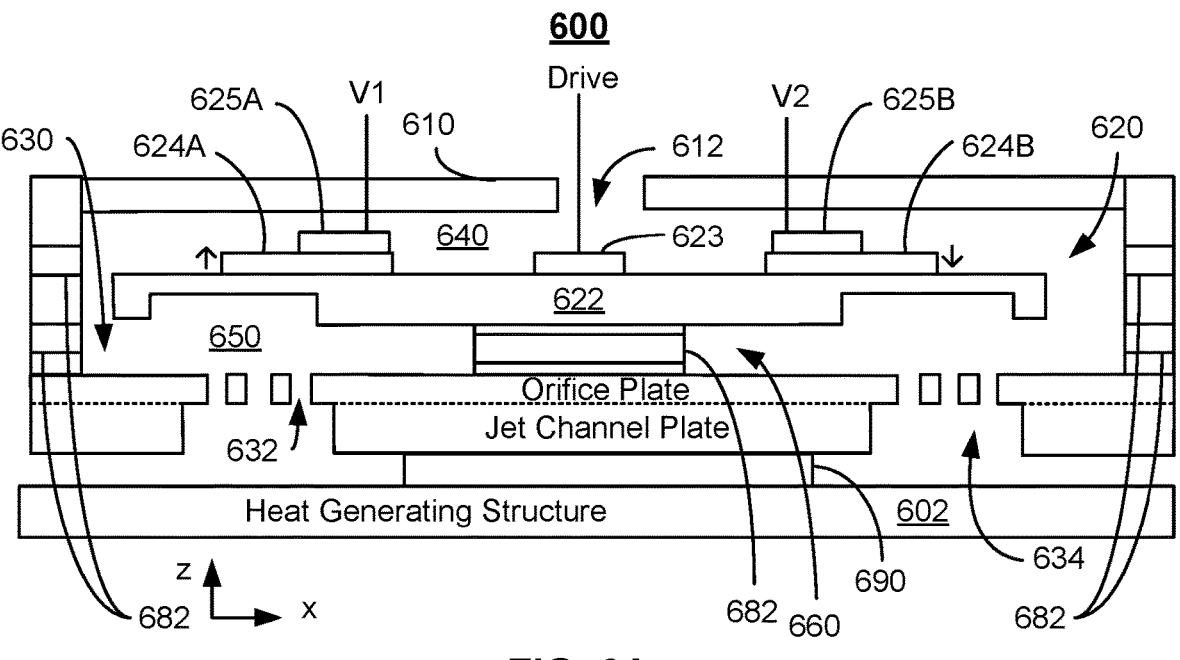
FIGS. 6A-6B depict an embodiment of an active MEMS cooling system including a centrally anchored cooling element and drivable using a single drive signal.
Figure 6B:
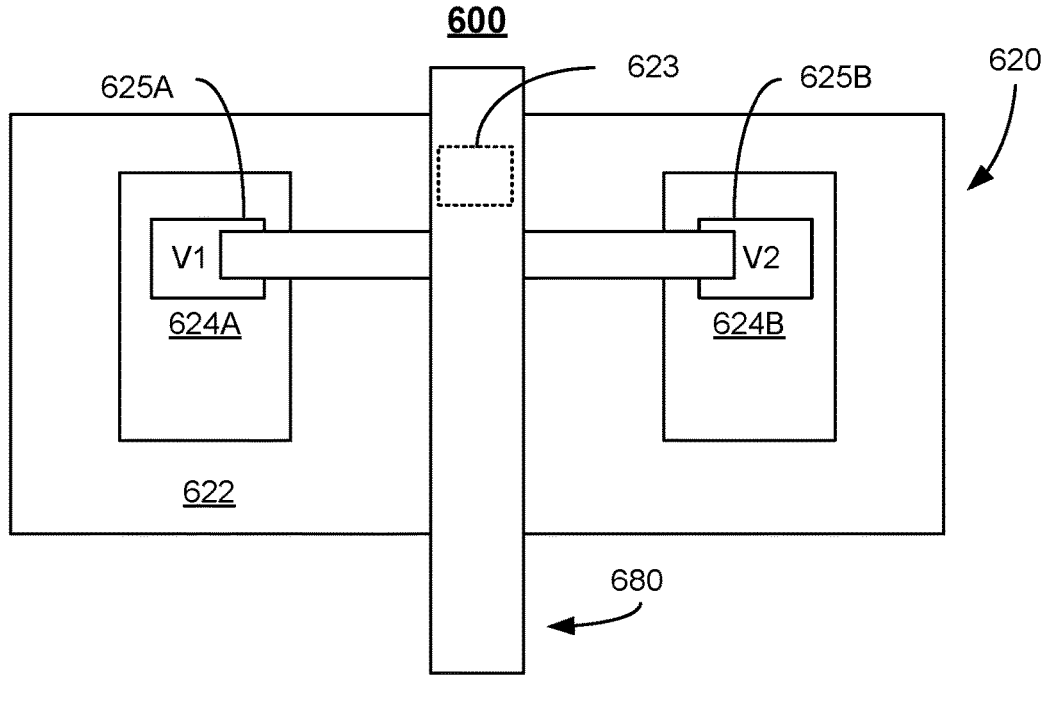

FIGS. 6A and 6B depict cross-sectional and plan views of an embodiment of active MEMS cooling system 600 including a centrally anchored cooling element. FIGS. 6A-6B are not to scale and for clarity, only some structures are shown. Cooling system 600 may be a cooling cell that is part of a cooling system including multiple cells, such as tile 300. The device cooled by MEMS cooling system 600 may be analogous to those with which cooling system 400 is used. In some embodiments, therefore, the device in which cooling system 600 is integrated has a thickness analogous to devices described with respect to cooling system 400.

Cooling system 600 includes cooling element 620, actuator 622, piezoelectrics 624A and 624B, bottom plate 630 having orifices 632 and cavities 634, top chamber 640, bottom chamber 650, anchor 660, and pedestal 690 that are analogous to cooling element 420, actuator 622, piezoelectrics 424A and 424B, bottom plate 430 having orifices 432 and cavities 434, top chamber 440, bottom chamber 450, anchor 460, and pedestal 490, respectively. Thus, cooling system 600 is analogous to 400. Cooling system 600 is also analogous to cooling system 500.

Piezoelectrics 624A and 624B are on opposite sides of anchor 660, are part of the cantilevered arms, and are used to drive different cantilevered arms. Piezoelectrics 624A and 624B are also poled such that piezoelectrics 624A and 624B are polarized in opposite directions in an analogous manner to piezoelectrics 424A and 424B and piezoelectrics 524A and 524B. The polarizations of piezoelectrics 624A and 624B are shown by arrows in FIG. 6A. In some such embodiments, the cantilevered arms of cooling element 620 are desired to be driven out-of-phase. In some embodiments, piezoelectrics 624A and 624B may be polarized in the same direction. In some such embodiments, the cantilevered arms of cooling element 620 are desired to be driven in-phase.

Drive electronics include flex connector 680, electrical contacts 623, 625A and 625B, biases V1 and V2, and signal Drive. Electrical contacts 625A and 625B are used to make electrical contact to a first side (i.e. the top) of piezoelectrics 624A and 624B, respectively. In some embodiments, electrical contacts 625A and 625B are metal pads, solder, or analogous structures. Electrical contact 623 is used to make electrical contact with actuator 622. Electrical contact 623 may be a metal pad, solder, or analogous structures. Actuator 622 is conductive and thus is electrically connected to the bottoms of piezoelectrics 624A and 624B. The drive electronics are configured such that piezoelectrics 624A and 624B are driven using a single drive signal, such that electric fields that do not exceed the coercivity (and may not exceed one-half or one-third of the coercivity) in the direction opposite to polarization, and such that the electric fields may generally be in the direction of polarization. Thus, cooling element 620 and drive electronics are analogous to cooling element 420 and drive electronics for cooling system 400 and cooling element 520 and drive electronics for cooling system 500. In the embodiment shown, piezoelectrics 624A and 624B are driven by electric fields generally in the positive z-direction and negative z-direction, respectively. Also shown are insulators 682. In embodiments in which cooling system 600 is assembled in layers, layers otherwise adjacent to the layer from which cooling element 620 is formed may be conductive. Insulators 682 electrically insulate cooling element 620 (i.e. actuator 622) from other conductive layers.

Piezoelectrics 624A and 624B are also driven by a single drive signal, which may be analogous to drive signal 582. Thus, the function of cooling system 600 is described in the context of drive signal 582. In operation, a voltage V3 is initially applied to pad 623 and thus to piezoelectrics 624A and 624B. Piezoelectric 624A is biased at V1 through pad 625A, while piezoelectric 624B is biased at V2 through pad 625B. Because of their biasing, piezoelectric 624A initially has a low voltage of V3-V1 (and minimum electric field), while piezoelectric 624B has a maximum voltage of V2-V3 (and maximum electric field in the direction of polarization). Through t1, drive signal 582 increases to V4, while biases V1 and V2 are constant. As a result, a voltage across piezoelectric 624A generates an electric field that increases in the direction of the polarization for piezoelectric 624A (i.e. the positive z-direction). In contrast, the voltage across piezoelectric 624B generates a decreasing electric field. At t1, a maximum electric field in the direction of polarization is reached for piezoelectric 624A and a minimum electric field is reached for piezoelectric 624B. Between t1 and t2, the electric field for piezoelectric 624A decreases back to a minimum, while the electric field for piezoelectric 624B increases to a maximum. This cycle repeats. As a result, the voltages across piezoelectrics 624A and 624B cause piezoelectrics 624A and 624B to drive actuator 622 to vibrate out-of-phase. Thus, a single drive signal causes the cantilevered arms of cooling element 620 to vibrate out-of-phase.

Cooling system 600 operates in an analogous manner to cooling system 100. Cooling element 620 is actuated to undergo out-of-phase vibrational motion and drive fluid through cooling system 600 in an analogous manner (e.g. with the same speed and/or flow rate in some embodiments) to cooling system 100. Cooling system 600 thus shares the benefits of cooling system 100. Thus, performance of a device employing cooling system 600 may be improved. Further, piezoelectrics 624A and 624B of cooling element 620 and drive electronics are configured such that the electric fields used do not depole piezoelectrics 624A and 624B. A single drive signal may also be used. This may simplify electronics and/or improve driving of cooling element 620. As a result, performance and reliability may be improved.

Figure 7A:
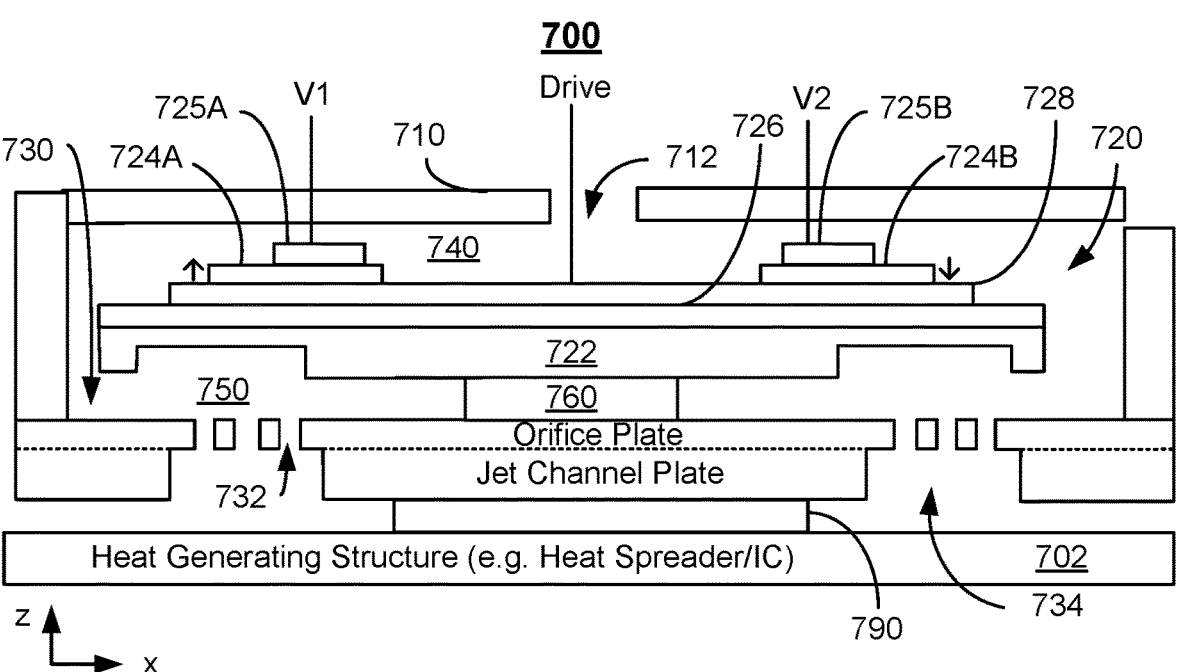
FIGS. 7A-7B depict an embodiment of an active MEMS cooling system including a centrally anchored cooling element and drivable using a single drive signal.
Figure 7B:
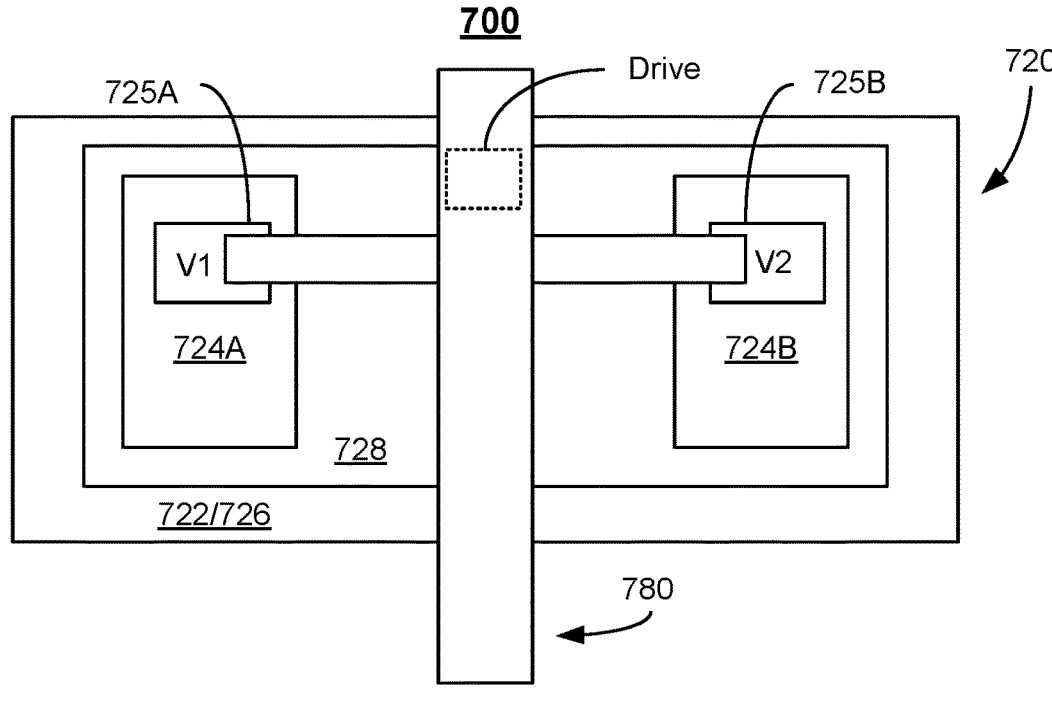

FIGS. 7A and 7B depict cross-sectional and plan views of an embodiment of active MEMS cooling system 700 including a centrally anchored cooling element. FIGS. 7A-7B are not to scale and for clarity, only some structures are shown. Cooling system 700 may be a cooling cell that is part of a cooling system including multiple cells, such as tile 300. The device cooled by MEMS cooling system 700 may be analogous to those with which cooling system 400 is used. In some embodiments, therefore, the device in which cooling system 700 is integrated has a thickness analogous to devices described with respect to cooling system 400.

Cooling system 700 includes cooling element 720, actuator 722, piezoelectrics 724A and 724B, bottom plate 730 having orifices 732 and cavities 734, top chamber 740, bottom chamber 750, anchor 760, and pedestal 790 that are analogous to cooling element 420, actuator 422, piezoelectrics 424A and 424B, bottom plate 430 having orifices 432 and cavities 434, top chamber 440, bottom chamber 450, anchor 460, and pedestal 490, respectively. Thus, cooling system 700 is analogous to 400. Cooling system 700 is also analogous to cooling system(s) 500 and/or 600.

Piezoelectrics 724A and 724B are on opposite sides of anchor 760, are part of the cantilevered arms, and are used to drive different cantilevered arms. Piezoelectrics 724A and 724B are also poled such that piezoelectrics 724A and 724B are polarized in opposite directions in an analogous manner to piezoelectrics 424A and 424B, piezoelectrics 524A and 524B, and piezoelectrics 624A and 624B. The polarizations of piezoelectrics 724A and 724B are shown by arrows in FIG. 7A. In some such embodiments, the cantilevered arms of cooling element 720 are desired to be driven out-of-phase. In some embodiments, piezoelectrics 724A and 724B may be polarized in the same direction. In some such embodiments, the cantilevered arms of cooling element 720 are desired to be driven in-phase.

Drive electronics include flex connector 780, electrical contacts 728, 725A and 725B, biases V1 and V2, and signal Drive. In some embodiments, electrical contacts 725A and 725B are used to make electrical contact to a first side of piezoelectrics 724A and 724B, respectively. In some embodiments, electrical contacts 725A and 725B are metal pads, solder, or analogous structures. Electrical contact 728 is used to make electrical contact with opposite sides of piezoelectrics 724A and 724B. Electrical contact 728 may be a metal pad or analogous structures. Also shown is insulating layer 726. Insulating layer 726 electrically insulates the drive electronics from actuator 722. For example, insulating layer 726 may include SiN and/or a SOG having sufficient thickness (e.g. at least 2.5 millimeters and not more than 4 millimeters) to insulate electrical contact 728 from actuator 722. The drive electronics are configured such that piezoelectrics 724A and 724B are driven using electric fields that are in the direction of polarization. Thus, cooling element 720 and drive electronics are analogous to cooling element 420 and drive electronics for cooling system 400, cooling element 520 and drive electronics for cooling system 500, and cooling element 620 and drive electronics for cooling system 600. In the embodiment shown, piezoelectrics 724A and 724B are driven by electric fields in the negative z-direction and positive z-direction, respectively.

Piezoelectrics 724A and 724B are also driven by a single drive signal, which may be analogous to drive signal 582. The drive electronics and piezoelectrics 724A and 724B thus operate in an analogous manner to the drive electronics and piezoelectrics 624A and 624B of system 600. Thus, a single drive signal causes the cantilevered arms of cooling element 720 to vibrate out-of-phase using electric fields aligned with the polarizations of piezoelectrics 724A and 724B. In addition, insulators analogous to insulators 682 need not be used. Instead, an insulating layer 726 may be provided on actuator 722. Further, actuator 722 need not be conductive. Thus, fabrication of cooling system 700 may be simplified.

Cooling system 700 operates in an analogous manner to cooling system 100. Cooling element 720 is actuated to undergo out-of-phase vibrational motion and drive fluid through cooling system 700 in an analogous manner (e.g. with the same speed and/or flow rate in some embodiments) to cooling system 100. Cooling system 700 thus shares the benefits of cooling system 100. Thus, performance of a device employing cooling system 700 may be improved. Further, piezoelectrics 724A and 724B of cooling element 720 and drive electronics are configured such that the electric fields used do not depole piezoelectrics 724A and 724B. A single drive signal may also be used. This may simplify electronics and/or improve driving of cooling element 720. Further, configuration of cooling system 700 may facilitate fabrication and operation. As a result, performance and reliability may be improved.

Figure 8A:
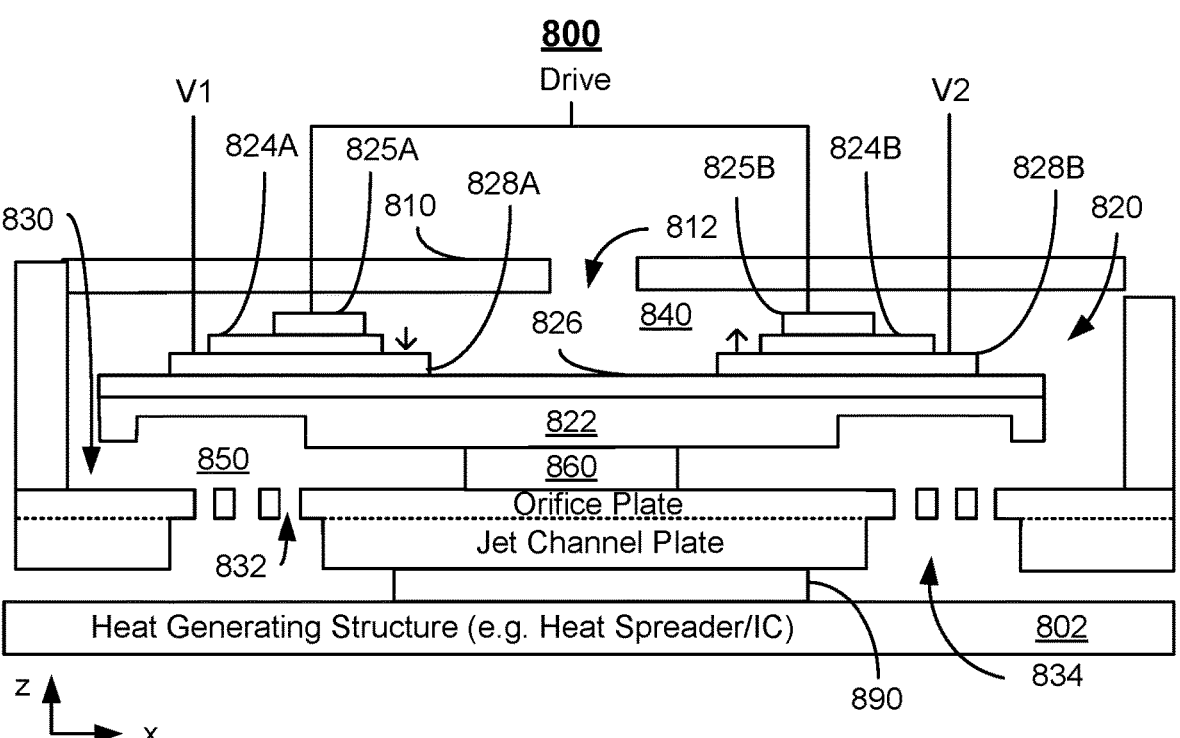
FIGS. 8A-8B depict an embodiment of an active MEMS cooling system including a centrally anchored cooling element and drivable using a single drive signal.
Figure 8B:
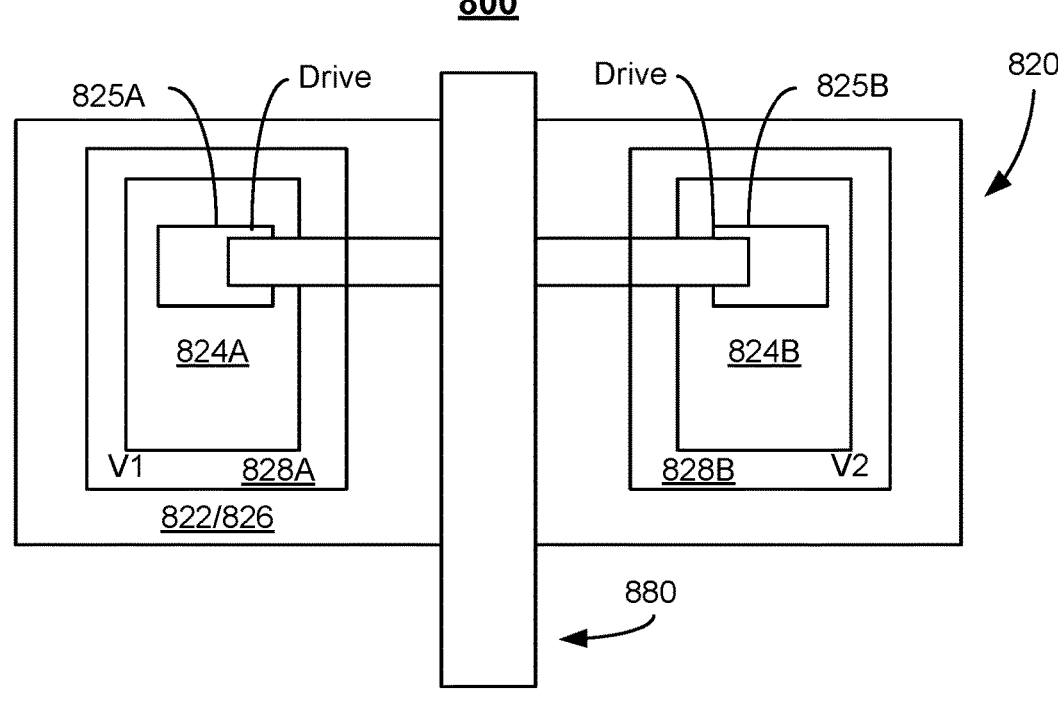

FIGS. 8A and 8B depict cross-sectional and plan views of an embodiment of active MEMS cooling system 800 including a centrally anchored cooling element. FIGS. 8A-8B are not to scale and for clarity, only some structures are shown. Cooling system 800 may be a cooling cell that is part of a cooling system including multiple cells, such as tile 300. The device cooled by MEMS cooling system 800 may be analogous to those with which cooling system 400 is used. In some embodiments, therefore, the device in which cooling system 800 is integrated has a thickness analogous to devices described with respect to cooling system 400.

Cooling system 800 includes cooling element 820, actuator 822, piezoelectrics 824A and 824B, bottom plate 830 having orifices 832 and cavities 834, top chamber 840, bottom chamber 850, anchor 860, and pedestal 890 that are analogous to cooling element 420, actuator 422, piezoelectrics 424A and 424B, bottom plate 430 having orifices 432 and cavities 434, top chamber 440, bottom chamber 450, anchor 460, and pedestal 490, respectively. Thus, cooling system 800 is analogous to 400. Cooling system 800 is also analogous to cooling system(s) 500, 600, and/or 700.

Piezoelectrics 824A and 824B are on opposite sides of anchor 860, are part of the cantilevered arms, and used to drive different cantilevered arms. Piezoelectrics 824A and 824B are also poled such that piezoelectrics 824A and 824B are polarized in opposite directions in an analogous manner to piezoelectrics 424A and 424B, piezoelectrics 524A and 524B, piezoelectrics 624A and 624B, and piezoelectrics 724A and 724B. However, the polarization for piezoelectric 424A is in the negative z-direction, while the polarization for piezoelectric 424B is in the positive z-direction. The polarizations of piezoelectrics 824A and 824B are shown by arrows in FIG. 8A. In some such embodiments, the cantilevered arms of cooling element 820 are desired to be driven out-of-phase. In some embodiments, piezoelectrics 824A and 824B may be polarized in the same direction. In some such embodiments, the cantilevered arms of cooling element 820 are desired to be driven in-phase.

Drive electronics include flex connector 880, electrical contacts 825A, 825B, 828A, and 828B, biases V1 and V2, and signal Drive. In some embodiments, electrical contacts 825A and 825B are used to make electrical contact to a first side of piezoelectrics 824A and 824B, respectively. Electrical contacts 828A and 828B are used to make electrical contact to opposite sides of piezoelectrics 824A and 824B, respectively. In some embodiments, electrical contacts 825A and 825B are metal pads, solder, or analogous structures. Electrical contacts 828A and 828B may be a metal pad or analogous structures. Also shown is insulating layer 826, which is analogous to insulating layer 726. Insulating layer 826 electrically insulates the drive electronics from actuator 822. The drive electronics are configured such that piezoelectrics 824A and 824B are driven using electric fields that do not exceed the coercivity (and may not exceed one-half or one-third of the coercivity) in the direction opposite to polarization and may generally be in the direction of polarization. Thus, cooling element 820 and drive electronics are analogous to cooling element 420 and drive electronics for cooling system 400, cooling element 520 and drive electronics for cooling system 500, cooling element 620 and drive electronics for cooling system 600, and cooling element 720 and drive electronics for cooling system 700. In the embodiment shown, piezoelectrics 824A and 824B are driven by electric fields in the negative z-direction and positive z-direction, respectively.

Piezoelectrics 824A and 824B are also driven by a single drive signal, which may be analogous to drive signal 582. The drive electronics and piezoelectrics 824A and 824B thus operate in an analogous manner to the drive electronics and piezoelectrics 624A and 624B of system 600 and to the drive electronics and piezoelectrics 724A and 724B of cooling system 700. However, the sides of piezoelectrics 824A and 824B to which the drive signal and biases are applied are switched. Thus, biases V1 and V2 are applied to the bottoms of piezoelectrics 824A and 824B via electrical contacts 828A and 828B, respectively. Consequently, the directions of polarization of piezoelectrics 824A and 824B have been switched. In other embodiments, biases may be switched. A single drive signal Drive is applied to the tops of piezoelectrics 824A and 824B through electrical contacts 825A and 825B, respectively. Thus, a single drive signal causes the cantilevered arms of cooling element 820 to vibrate out-of-phase using electric fields aligned with the polarizations of piezoelectrics 824A and 824B. In addition, insulators analogous to insulators 682 need not be used. Instead, an insulating layer 826 may be provided on actuator 822. Further, actuator 822 need not be conductive. Thus, fabrication of cooling system 800 may be simplified.

Cooling system 800 operates in an analogous manner to cooling system 100. Cooling element 820 is actuated to undergo out-of-phase vibrational motion and drive fluid through cooling system 800 in an analogous manner (e.g. with the same speed and/or flow rate in some embodiments) to cooling system 100. Cooling system 800 thus shares the benefits of cooling system 100. Thus, performance of a device employing cooling system 800 may be improved. Further, piezoelectrics 824A and 824B of cooling element 820 and drive electronics are configured such that the electric fields used do not depole piezoelectrics 824A and 824B. A single drive signal may also be used. This may simplify electronics and/or improve driving of cooling element 820. Further, configuration of cooling system 800 may facilitate fabrication and operation. As a result, performance and reliability may be improved.

Figure 9:
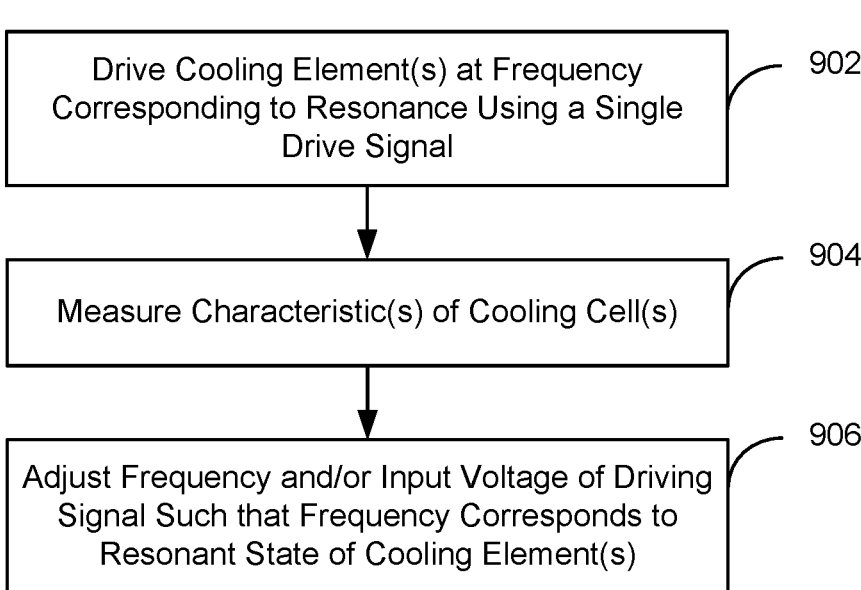
FIG. 9 depicts an embodiment of a method for using an active cooling mems system.

FIG. 9 depicts an embodiment of method 900 for using an active cooling mems system. Method 900 may include steps that are not depicted for simplicity. Method 900 is described in the context of systems 400 and 700. However, method 900 may be used with other cooling systems including but not limited to systems and cells described herein.

A driving signal at a frequency and an input voltage corresponding to the resonant state of one or more cooling elements is provided to the active MEMS cooling system, at

902. In some embodiments, a driving signal having the frequency corresponding to the resonant frequency of a specific cooling element is provided to that cooling element. In some embodiments, a driving signal is provided to multiple cooling elements. In such embodiments, the frequency of the driving signal corresponds to the resonant state of one or more cooling elements being driven, a statistical measure of the resonance, and/or within a threshold of the resonance as discussed above.

Further, a single driving signal in conjunction with biases may be used at 902. In some embodiments, 902 includes providing a constant bias to one side of the piezoelectrics used to drive the cooling element. A single drive signal is applied to the opposite sides of the piezoelectrics used to drive the cooling element. The biases and drive signal are selected such that the piezoelectrics used are not depoled and such that the desired type of motion (e.g. out-of-phase vibration of cantilevered arms of the cooling element) is achieved.

Characteristic(s) of the MEMS cooling system are monitored while the cooling element(s) are driven to provide a feedback signal corresponding to a proximity to a resonant state of the cooling element(s), at 904. In some embodiments, characteristic(s) of each individual cooling element are monitored to determine the deviation of the frequency of vibration for that cooling element from the resonant frequency of that cooling element. In some embodiments, characteristic(s) for multiple cooling elements are monitored at 904. The characteristic(s) monitored may be a proxy for resonance and/or a deviation therefrom. For example, the voltage at the cooling element, the power drawn by the cooling element, power output by the power source, peak-to-peak current output by the power source, peak voltage output by the power source, average current output by the power source, RMS current output by the power source, average voltage output by the power source, amplitude of displacement of the at least one cooling element, RMS current through the cooling element, peak voltage at the cooling element, average current through the cooling element, average voltage at the at least one cooling element, and/or the peak current drawn by the cooling element may be monitored. Using the characteristic(s) monitored, a deviation from the resonant state of the cooling element (e.g. deviation of the driving/vibration frequency from the resonant frequency) may be determined.

The frequency and/or input voltage is adjusted based on the feedback signal, at 906. More specifically, 906 includes updating the frequency and/or input voltage, based on the feedback signal, to correspond to resonant state(s) of the cooling element(s) at 906. For example, the frequency for the drive signal may be updated to more closely match the resonant frequency/frequencies. In some embodiments, updating the frequency includes changing the frequency to correspond to a power drawn corresponding to the vibration of the cooling element(s) being maximized, a voltage provided at the cooling element(s) being maximized, a voltage across the cooling element(s) being minimized, and/or an amplitude of a current drawn by the at least one cooling element being minimized. In some embodiments, 906 includes determining whether the feedback signal indicates that a drift in the resonant frequency of the cooling element(s) exceeds a threshold and identifying a new frequency in response to a determination that the drift exceeds the threshold. The new frequency accounts for the drift in the resonant frequency. The method also includes setting the new frequency as the frequency for the driving signal in response to the new frequency being identified.

For example, cooling element 420 or 720 in MEMS cooling system 400 or 700 is driven, at 902. As part of 902, the biases (e.g. V1 and V2) and drive signal (e.g. Drive) are selected and applied to the appropriate sides of the piezoelectrics so that a single drive signal can be used to drive the cooling element. In addition, 902 is performed such that the electric fields driving piezoelectrics are consistent with the polarizations of the piezoelectrics. Thus, the electric fields driving the cooling element do not exceed the coercivity (and may not exceed one-half or one-third of the coercivity) in the direction opposite to polarization of each piezoelectric. Further, the cooling element 420 or 720 is driven at a frequency that is at or near resonance for one or more of the cooling elements. The applied voltages may also be based on the temperature of operation to ensure that the polarization limits are not crossed and the deflections are controlled to the expected values. Characteristics of cooling element 420 or 720 within MEMS cooling system 400 or 700 are monitored, at 904. Thus, the drift of the cooling element(s) 420 and/or 720 from resonance may be determined. The frequency may be adjusted based on the monitoring of 904, at 906. Thus, MEMS cooling system 400 or 700 may be kept at or near resonance. Further, cooling elements 420 and 720 are not depoled and may be driven using a single drive signal for out-of-phase motion. Although method 900 and cooling systems 400, 500, 600, 700, and 800 are described in the context of out-of-phase motion, the directions of polarization and/or biasing may be configured such that piezoelectrics are driven in-phase.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A cooling system, comprising:

a support structure;

a cooling element having a central axis, the cooling element being supported by the support structure at the central axis such that a first portion of the cooling element on a first side of the central axis and a second portion of the cooling element on a second side of the central axis opposite to the first side are unpinned, the first portion and the second portion of the cooling element being configured to undergo vibrational motion when actuated to drive a fluid toward a heat-generating structure, the cooling element further including a first piezoelectric having a first polarization and a second piezoelectric having a second polarization opposite to the first polarization, the first piezoelectric being part of the first portion of the cooling element, the second piezoelectric being part of the second portion of the cooling element; and drive electronics configured to drive the first portion of the cooling element and the second portion in the cooling element using a single drive signal.

2. The cooling system of claim 1, wherein the drive electronics are configured to apply a first electric field to the first piezoelectric along the first polarization and a second electric field to the second piezoelectric along the second polarization, the first electric field not exceeding one-half of a first coercivity of the first piezoelectric in a first direction opposite to the first polarization, the second electric field not exceeding one-half of a second coercivity of the second piezoelectric in a second direction opposite to the second polarization.

3. The cooling system of claim 1, wherein the first piezoelectric and the second piezoelectric are oppositely biased such that the cooling element is driven in an out-of-phase mode by the drive electronics.

4. The cooling system of claim 1, wherein the cooling element includes an actuator, the first piezoelectric residing on a first portion of the actuator, and the second piezoelectric residing on a second portion of the actuator.

5. The cooling system of claim 4 wherein the actuator is electrically conductive and electrically isolated from at least the support structure, wherein the drive electronics provide the single drive signal to the actuator.

6. The cooling system of claim 5, wherein the drive electronics further include:

a flex connector that provides the single drive signal to the actuator, a first bias to the first piezoelectric and a second bias to the second piezoelectric.

7. The cooling system of claim 4, wherein the cooling element further includes:

at least one insulator between the first piezoelectric and the actuator and between the second piezoelectric and the actuator; and an electrical contact on the at least one insulator, the electrical contact receiving the single drive signal and providing the single drive signal to a first side of the first piezoelectric and to a first side of the second piezoelectric; and wherein the drive electronics further include a flex connector providing a first bias signal to a second side of the first piezoelectric, providing a second bias signal to a second side of the second piezoelectric, and providing the single drive signal to the electrical contact, the first side of the first piezoelectric being opposite to the second side of the first piezoelectric, the first side of the second piezoelectric being opposite to the second side of the second piezoelectric.

8. The cooling system of claim 4, wherein the cooling element further includes:

at least one insulator between the first piezoelectric and the actuator and between the second piezoelectric and the actuator;

a first electrical contact on a first portion of the at least one insulator, the first electrical contact being electrically connected to the first piezoelectric and providing a first bias to the first piezoelectric; and a second electrical contact on a second portion of the at least one insulator, the second electrical contact being electrically connected to the second piezoelectric and providing a second bias to the second piezoelectric;

wherein the drive electronics further include a flex connector providing the single drive signal to the first piezoelectric and the second piezoelectric.

9. A cooling system, comprising:

a plurality of cooling cells, each of the plurality of cooling cells including a support structure and a cooling element having a central axis, the cooling element being supported by the support structure at the central axis such that a first portion of the cooling element on a first side of the central axis and a second portion of the cooling element on a second side of the central axis opposite to the first side are unpinned, the first portion and the second portion of the cooling element being configured to undergo vibrational motion when actuated to drive a fluid toward a heat-generating structure, the cooling element further including a first piezoelectric having a first polarization and a second piezoelectric having a second polarization opposite to the first polarization, the first piezoelectric being part of the first portion of the cooling element, the second piezoelectric being part of the second portion of the cooling element; and drive electronics configured to drive each of the plurality of cooling cells such that the first portion of the cooling element and the second portion in the cooling element are driven by a single drive signal.

10. The cooling system of claim 9, wherein the drive electronics are configured to apply a first electric field to the first piezoelectric along the first polarization and a second electric field to the second piezoelectric along the second polarization, the first electric field not exceeding one-half of a first coercivity of the first piezoelectric in a first direction opposite to the first polarization, the second electric field not exceeding one-half of a second coercivity of the second piezoelectric in a second direction opposite to the second polarization.

11. The cooling system of claim 9, wherein the first piezoelectric and the second piezoelectric are oppositely biased such that the cooling element is driven in an out-of-phase mode by the drive electronics.

12. The cooling system of claim 9, wherein the cooling element includes an actuator, the first piezoelectric residing on a first portion of the actuator, and the second piezoelectric residing on a second portion of the actuator.

13. The cooling system of claim 12 wherein the actuator is electrically conductive and electrically isolated from at least the support structure, wherein the drive electronics provide the single drive signal to the actuator; and wherein the drive electronics further include:

a flex connector including that provides the single drive signal to the actuator, a first bias to the first piezoelectric and a second bias to the second piezoelectric.

14. The cooling system of claim 12, wherein the cooling element further includes:

at least one insulator between the first piezoelectric and the actuator and between the second piezoelectric and the actuator; and an electrical contact on the at least one insulator, the electrical contact receiving the single drive signal and providing the single drive signal to a first side of the first piezoelectric and to a first side of the second piezoelectric; and wherein the drive electronics further include a flex connector providing a first bias signal to a second side of the first piezoelectric, providing a second bias signal to a second side of the second piezoelectric, and providing the single drive signal to the electrical contact, the first side of the first piezoelectric being opposite to the second side of the first piezoelectric, the first side of the second piezoelectric being opposite to the second side of the second piezoelectric.

15. A method of cooling a heat-generating structure, comprising:

driving a cooling element to induce a vibrational motion at a frequency using a single drive signal, the cooling element having a central axis, the cooling element being supported by a support structure at the central axis such that a first portion of the cooling element on a first side of the central axis and a second portion of the cooling element on a second side of the central axis opposite to the first side are unpinned, the first portion and the second portion of the cooling element being configured to undergo the vibrational motion when actuated to drive a fluid toward the heat-generating structure, the cooling element further including a first piezoelectric having a first polarization and a second piezoelectric having a second polarization opposite to the first polarization, the first piezoelectric being part of the first portion of the cooling element, the second piezoelectric being part of the second portion of the cooling element.

16. The method of claim 15, wherein the driving further includes:

applying a first electric field to the first piezoelectric along the first polarization and a second electric field to the second piezoelectric along the second polarization, the first electric field not exceeding one-half of a first coercivity of the first piezoelectric in a first direction opposite to the first polarization, the second electric field not exceeding one-half of a second coercivity of the second piezoelectric in a second direction opposite to the second polarization.

17. The method of claim 15, wherein the first piezoelectric and the second piezoelectric are oppositely biased such that the cooling element is driven in an out-of-phase mode by the single drive signal.

18. The method of claim 15, wherein the cooling element includes an actuator, the first piezoelectric residing on a first portion of the actuator, and the second piezoelectric residing on a second portion of the actuator; wherein the actuator is electrically conductive and electrically isolated from at least the support structure, wherein the driving further includes:

providing the single drive signal to the actuator.

19. The method of claim 18, wherein the driving further includes:

providing the single drive signal to the actuator;

providing a first bias to the first piezoelectric; and providing a second bias to the second piezoelectric, the second bias being different from the first bias.

20. The method of claim 18, wherein the cooling element further includes at least one insulator and an electrical contact on the at least one insulator, the at least one insulator being between the first piezoelectric and the actuator and between the second piezoelectric and the actuator, the electrical contact receiving the single drive signal and providing the single drive signal to a first side of the first piezoelectric and to a first side of the second piezoelectric; and wherein the driving further includes:

providing a first bias signal to a second side of the first piezoelectric;

providing a second bias signal to a second side of the second piezoelectric; and providing the single drive signal to the electrical contact, the first side of the first piezoelectric being opposite to the second side of the first piezoelectric, the first side of the second piezoelectric being opposite to the second side of the second piezoelectric.

* * * * *